(12) United States Patent
Hiblot et al.

(10) Patent No.: US 10,607,901 B2
(45) Date of Patent: Mar. 31, 2020

(54) STRESS SENSOR FOR SEMICONDUCTOR COMPONENTS

(71) Applicant: IMEC VZW, Leuven (BE)

(72) Inventors: Gaspard Hiblot, Heverlee (BE); Geert Van der Plas, Leuven (BE); Stefaan Van Huylenbroeck, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/121,369

(22) Filed: Sep. 4, 2018

(65) Prior Publication Data

US 2019/0074231 A1 Mar. 7, 2019

(30) Foreign Application Priority Data

Sep. 5, 2017 (EP) .................................. 17189517

(51) Int. Cl.
*H01L 21/66* (2006.01)
*G01L 1/18* (2006.01)
(Continued)

(52) U.S. Cl.
CPC ................ *H01L 22/32* (2013.01); *G01L 1/16* (2013.01); *G01L 1/18* (2013.01); *G01L 1/2293* (2013.01);
(Continued)

(58) Field of Classification Search
CPC ... H01L 21/26513; H01L 22/32; G01L 5/161; G01L 1/18; G01L 1/2293; G01L 1/16
See application file for complete search history.

(56) References Cited

U.S. PATENT DOCUMENTS

| 6,150,681 A | 11/2000 | Allen |
| 2019/0043734 A1* | 2/2019 | Kapusta .................. H01L 23/16 |

(Continued)

FOREIGN PATENT DOCUMENTS

| CN | 104819789 A | 8/2015 |
| FR | 2950427 A1 | 3/2011 |

OTHER PUBLICATIONS

Lemke, Benjamin et al., "Piezoresistive CMOS-Compatible Sensor for Out-of-Plan Shear Stress", Sensors and Actuators, vol. 189, 2013, pp. 488-495.

(Continued)

*Primary Examiner* — Dung A. Le
(74) *Attorney, Agent, or Firm* — McDonnell Boehnen Hulbert & Berghoff LLP

(57) ABSTRACT

An example embodiment may include a sensor for monitoring and/or measuring stress in a semiconductor component. The component may include a substrate formed of a semiconductor material. The substrate may include a planar main surface. The sensor may include at least one slanted surface of the substrate material, the slanted surface being defined by an oblique inclination angle with respect to the main surface of the substrate. The sensor may also include at least one straight resistive path extending on at least part of the slanted surface and a plurality of contacts and terminals for accessing the at least one resistive path. The contacts and terminals may allow for the measurement of an electrical resistance of the resistive path and an assessment of a shear stress in a plane that is not parallel to the main surface of the substrate.

16 Claims, 15 Drawing Sheets

(51) Int. Cl.
  *G01L 1/22* (2006.01)
  *G01L 1/16* (2006.01)
  *G01L 5/161* (2020.01)
  *H01L 21/265* (2006.01)
(52) U.S. Cl.
  CPC ........ *G01L 5/161* (2013.01); *H01L 21/26513* (2013.01)

(56) References Cited

U.S. PATENT DOCUMENTS

2019/0195968 A1* 6/2019 Yuan .................... G01R 33/096
2019/0221679 A1* 7/2019 Gershtenman-Avsian ..................
                                                       H01L 23/10

OTHER PUBLICATIONS

Baumann, M. et al., "Piezoresistive CMOS Sensors for Out-of-Plane Shear Stress", IEEE Sensors 2009 Conference, 2009, pp. 441-444.
Suhling, Jeffrey C. et al., Silicon Piezoresistive Stress Sensors and Their Application in Electronic Packaging, IEEE Sensors Journal, vol. 1, No. 1, Jun. 2001, pp. 14-30.
Partial European Search Report, European Patent Application No. 17189517.0, dated Mar. 19, 2018, 14 pages.
Doelle, Michael et al., "A Novel Stress Sensor Baed on the Transverse Pseudo-Hall Effect of Mosfets", IEEE the Sixteenth Annual International Conference on Micro Electro Mechanical Systems, 2003, pp. 490-493.
Lemke, B. et al., "Towards Piezoresistive CMOS Sensors for Out-Of-Plane Stress", Proceedings IEEE 22nd International Conference on Micro Electro Mechanical Systems, Mar. 2009, pp. 781-784.

* cited by examiner

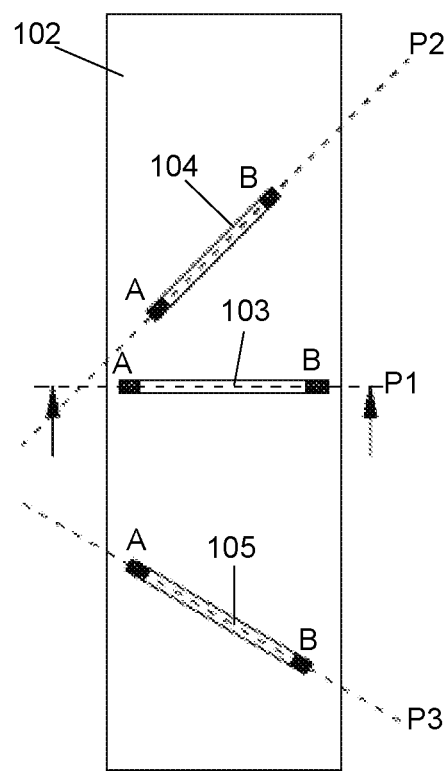
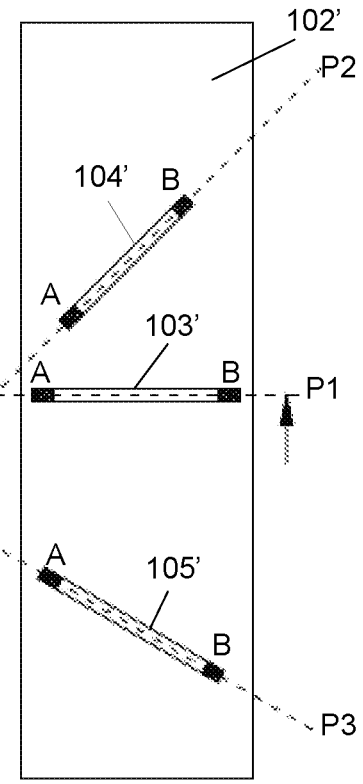
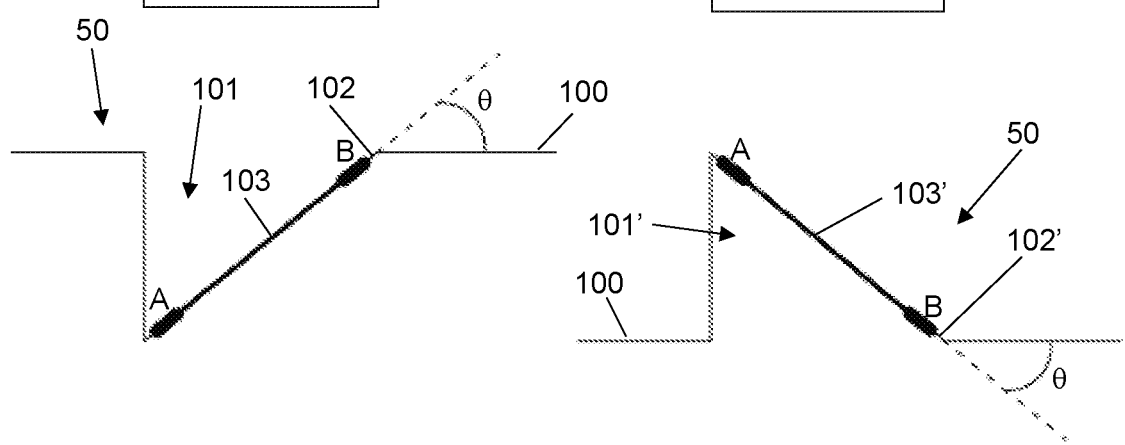
FIG. 1a                    FIG. 1b

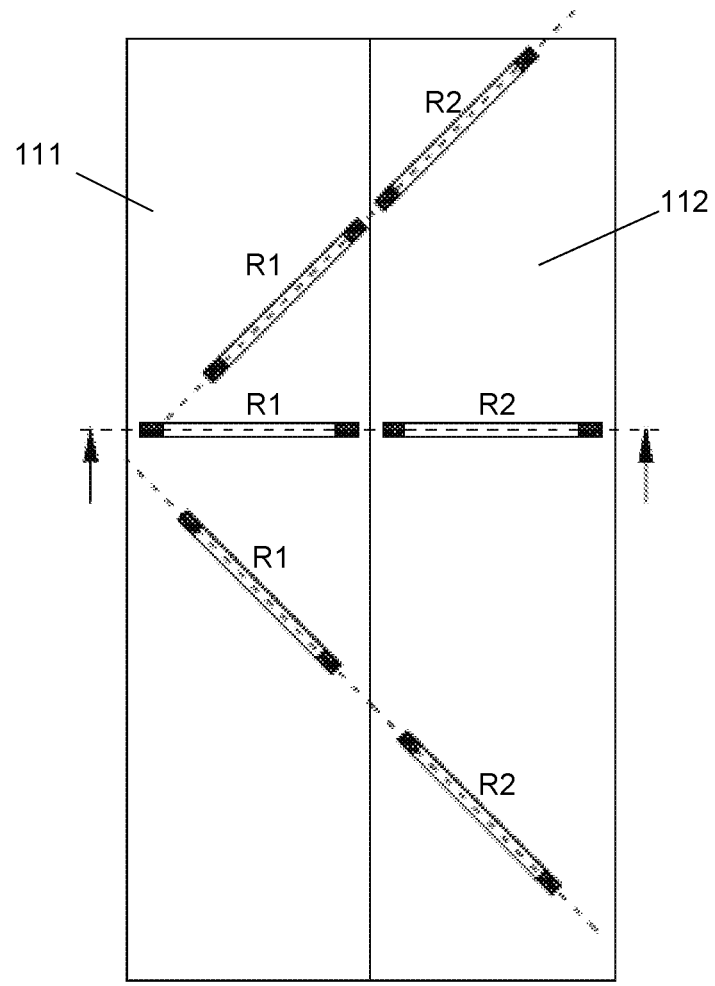
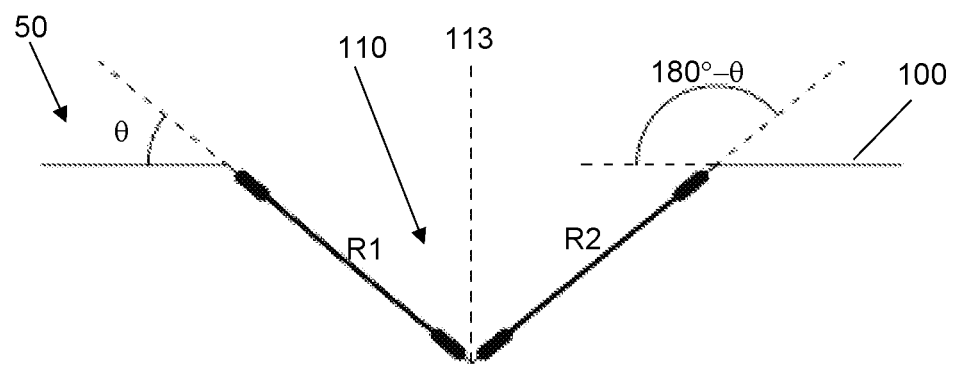
FIG. 2

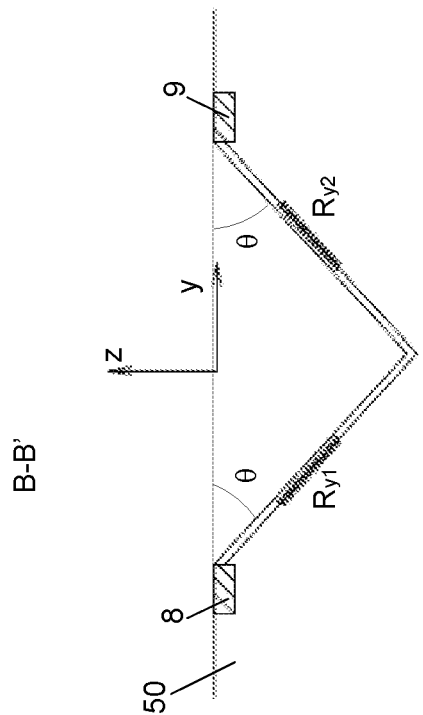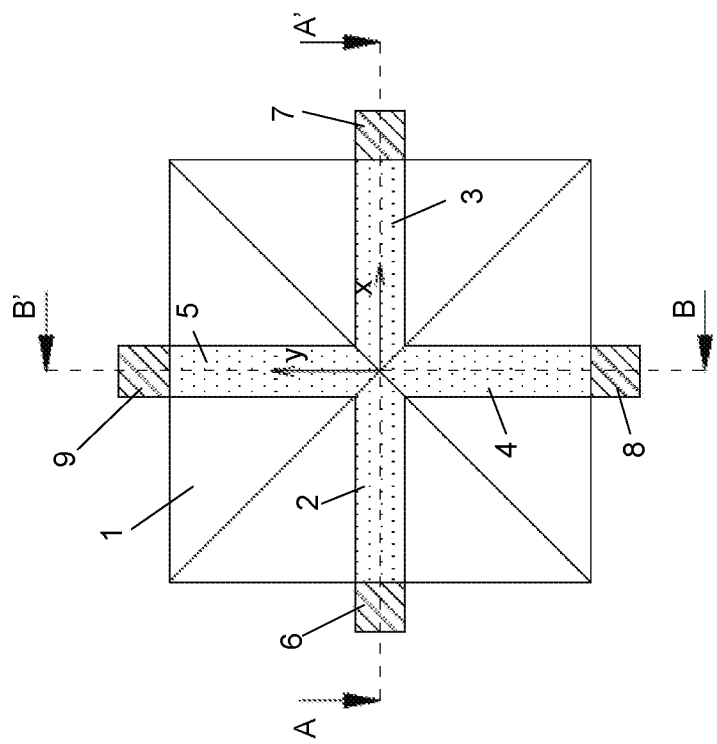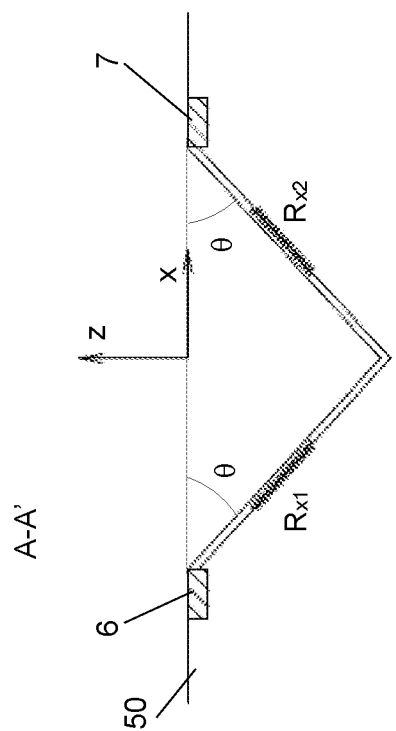
FIG. 5

STRESS SENSOR FOR SEMICONDUCTOR COMPONENTS

CROSS-REFERENCE TO RELATED APPLICATIONS

The present application is a non-provisional patent application claiming priority to European Patent Application No. 17189517.0, filed Sep. 5, 2017, the contents of which are hereby incorporated by reference.

FIELD OF THE DISCLOSURE

The present disclosure is related to a stress sensor integrated in a semiconductor component such as an integrated circuit chip.

BACKGROUND

Mechanical stress can be detrimental for the operation of integrated circuits and other semiconductor components. Packaging induced stress is known to affect significantly the performance of transistors and circuits. Similarly, 3D interconnects such as through-substrate vias (TSVs) are known to introduce stress in the active regions of the wafer. It is therefore necessary to evaluate the stress in terms of the stress components of the stress tensor which consists of three normal components $\sigma_{xx}$, $\sigma_{yy}$ and $\sigma_{zz}$ and three shear components $\sigma_{xz}$, $\sigma_{yz}$ and $\sigma_{xy}$, defined with respect to orthogonal directions x, y and z with the xy plane corresponding to the plane of the semiconductor wafer from which the IC or other component is fabricated.

One approach to detecting package-induced stress is based on the piezo-resistive effect in diffused resistors or transistors. One example of a piezo-resistive stress sensor built on this principle is the rosette sensor described in detail in document "Silicon piezo-resistive stress sensors and their application in electronic packaging," Suhling and Jaeger, IEEE Sensors Journal, vol. 1, no. 1, pp. 14-30, June 2001. The shift in resistance of complementary type diffused resistors oriented along different directions is monitored to deduce the stress present in the active material. To compensate for the impact of temperature variations during measurements, these resistance shifts are subtracted one from the other so as to cancel the impact of thermal effects on resistors. These types of sensors however suffer from three main limitations. Firstly, they are not sensitive to out-of-plane shear stress components on a wafer surface, which is the one commonly employed for CMOS technology. Secondly, the resistor sensitivity to $\sigma_{zz}$ does not change with a planar rotation of the sensor on a surface, so its contribution is regularly cancelled out with the one from the temperature. Thirdly, it is only possible to extract the difference ($\sigma_{xx}-\sigma_{yy}$) and not the two components $\sigma_{xx}$ and $\sigma_{yy}$ individually, once again due to the need to compensate for temperature.

To determine the remaining coefficients ($\sigma_{xz}$, $\sigma_{yz}$, $\sigma_{zz}$, and ($\sigma_{xx}+\sigma_{yy}$)), one approach is to build rosette sensors on a surface, where the transformed piezoresistive matrix provides more orientation-dependent coefficients. Therefore, variations of resistances oriented in different directions due to stress have the potential to provide an independent family of linear equations from which the stress components can be extracted. Nonetheless, the in-plane resistivity matrix being symmetric, it features only 3 independent components. Any in-plane rotation of the resistor can only result in a combination of these three coefficients. Thus at most 3 independent equations can be extracted from a single-polarity rosette sensor, and one is inevitably lost for temperature compensation. In any case, all the sensors based on a surface cannot be processed in conventional CMOS technology where the wafer surface is oriented along the direction.

Another solution reported in literature is to create a non-planar current on a oriented wafer, as illustrated by documents: "Towards piezo-resistive CMOS sensors for out-of-plane stress", Lemke et al, Proceedings, IEEE 22nd International Conference on Micro Electro Mechanical Systems, March 2009 and "Piezoresistive CMOS sensors for out-of-plane shear stress", Baumann et al, Proceedings IEEE Sensors Conference, 2009. In these sensor designs, the current is forced below a shallow trench isolation (similarly to an STI diode), which makes it non-planar. This principle can be used to detect both $\sigma_{zz}$ and the out-of-plane shear stress $\sigma_{xz}$ and $\sigma_y z$. However the extraction of the $\sigma_{zz}$, $\sigma_{xz}$, and $\sigma_{yz}$ is very challenging. Indeed, a large part of the current trajectory (below the spacer) is non-vertical. As a result, the structure must be repeated with different STI widths to de-embed $\sigma_{zz}$ from all the others as explained in the above-identified reference by Lemke et al. In the pseudo-Hall sensor used in the above-identified reference by Baumann et al, no solution is proposed to de-embed between the contribution of $\sigma_{xz}$ (vertical current on the sidewalls of the STI) and $\sigma_{xy}$ (horizontal current under the STI).

V-groove stress sensors are a well-known technique used in the MEMS industry to fabricate sensors. In particular, it has also been used to build membrane sensors that can detect a pressure applied by an external force on the chip. However in that case the V-groove is used simply to build a mechanical structure. The electrical characteristics of the resulting slanted surfaces are not exploited. For example in document U.S. Pat. No. 6,150,681, the piezo-resistive sensors are put on the membrane and not on the slanted surfaces themselves. Furthermore, all piezo-resistive sensors relying on a free membrane or an internal cavity are not suitable for detecting packaging-induced stress precisely because they are sensitive to the external stress (which they are meant to detect).

SUMMARY

The disclosure is related to a sensor and to a semiconductor component in accordance with the appended claims. The sensor of the disclosure is configured to be incorporated in a semiconductor component such as an integrated circuit chip. The component comprises a semiconductor substrate, the substrate originating from the semiconductor wafer onto which a plurality of chips are built. A stress sensor according to the present disclosure comprises one or more slanted surfaces of the semiconductor substrate material with a known oblique inclination angle relative to the main surface of the substrate, and resistive paths at least on the slanted surfaces. According to an example embodiment, two slanted surfaces are provided with complementary inclination angles relative to the main surface, and one or more pairs of resistive paths are produced on the pair of surfaces, the inclination angles of the paths of each pair being equally complementary. The knowledge of the inclination angle allows to determine the out-of-plane stress components based on a measurement of the resistance of the slanted resistive paths. The sensor may comprise a cavity open to the main surface, or a 3D shape on the main surface, and a number of resistive paths on the slanted sidewalls of the cavity or 3D-shape, as well as a number of contacts and terminals for accessing the resistive paths. According to other embodiments, the sensor further comprises planar resistive paths in the vicinity of the cavity or 3D shape, which allow to determine the normal stress components, as well as the in-plane shear stress.

The sensor described in the disclosure provides a way of monitoring or determining the out-of-plane shear stress that is technically straightforward and reliable in comparison with the existing approaches referred to above. The disclosure is firstly related to a sensor for monitoring and/or measuring stress in a semiconductor component, the component comprising a substrate formed of a semiconductor material, the substrate comprising a planar main surface, the sensor comprising at least one slanted surface of the substrate material. The slanted surface is defined by an oblique inclination angle with respect to the main surface of the substrate. The sensor also comprises at least one straight resistive path extending on at least part of the slanted surface. The straight resistive path is thus also oriented at an oblique inclination angle relative to the main surface of the substrate. The angle can be the same angle as the angle of the slanted surface, or it can differ from the angle. According to an example embodiment, the inclination angle between the resistive path and the main surface is between 20° and 70°. The sensor further comprises a plurality of contacts and terminals for accessing the slanted resistive path, thereby allowing the measurement of the electrical resistance of the resistive path and the assessment of the shear stress in a plane that is not parallel to the main surface of the substrate.

According to an embodiment, the sensor comprises at least one pair of slanted surfaces having complementary inclination angles relative to the main surface, and comprising at least one pair of resistive paths which lie in a first plane, the first path on the first slanted surface and the second path on the second slanted surface, wherein the pair of slanted resistive paths also have complementary inclination angles relative to the main surface, and wherein the sensor is configured to measure the shear stress in the first plane defined by the pair of resistive paths.

The sensor may comprise two of the pairs of slanted surfaces and slanted resistive paths, and be configured to measure the shear stress in a first and second plane, the planes being two mutually non-parallel planes, which may include two mutually orthogonal planes.

According to an embodiment, the sensor further comprises a plurality of planar resistive paths parallel to the plane of the main surface of the substrate and located in the vicinity of the slanted resistive paths, as well as a plurality of contacts and terminals for accessing the planar resistive paths, thereby allowing for the measurement of the electrical resistance of the planar paths and the assessment of one or more additional stress components.

According to some embodiments, the one or more slanted surfaces are the slanted sidewalls of one or more cavities which are open to the main surface of the substrate or to another surface of the substrate and/or the slanted surfaces are the slanted sidewalls of 3-dimensional shapes extending outward from the main surface of the substrate or from another surface of the substrate.

According to an embodiment, the sensor comprises a cavity or a 3D shape having the shape of a 4-walled pyramid or a frustum of a 4-walled pyramid, comprising a rectangular or square base, a centrally located tip area, four slanted walls extending respectively between the four edges of the base and the tip area, the four walls forming two pairs of slanted surfaces, the surfaces of each pair having complementary inclination angles relative to the main surface of the substrate, and four slanted ribs extending respectively between the corners of the base and the tip area. The sensor also comprises four electrical contacts. In some embodiments, these contacts are placed along the edges of the base of the pyramid, which may include the midpoint of the edges. In the latter case, the inclination angle between the four paths and the substrate main surface is essentially the same as the inclination angle of the respective slanted surfaces of the pyramid. The sensor also comprises four slanted resistive paths respectively on the four slanted surfaces, the four paths extending between the tip area and the four electrical contacts, the paths on opposite surfaces having complementary inclination angles relative to the main surface of the substrate.

The sensor according to the previous paragraph may further comprise a fifth electrical contact located in the tip area, the four resistive paths extending respectively between the four contacts and the fifth contact. Alternatively, the four slanted resistive paths merge in the tip area and the slanted resistive paths on opposing walls of the cavity or the 3D shape are matched in terms of their electric resistance.

The sensor comprising a pyramid-shaped cavity or 3D shape as described above may further comprise (i) two planar resistive paths in the vicinity of the cavity or the 3D shape, the two planar paths running along perpendicular lines in the plane of the main surface of the substrate; (ii) electrical contacts at the start and end location of each planar resistive path, and terminals for accessing the contacts; (iii) four additional electrical contacts placed around the cavity or the 3D shape, one on each of the four corners of the cavity or the 3D shape, and terminals for accessing the corner contacts; and (iv) four slanted resistive paths, each path running along one of the ribs of the cavity or the 3D shape, between the respective corner contacts and the tip area of the cavity or the 3D shape.

The sensor according to the preceding paragraph may further comprise two additional planar resistive paths, as well as contacts at the start and end location of each additional planar path, wherein the two additional planar paths run parallel respectively to the two perpendicular planar paths, wherein the two additional planar paths run on the opposite side of the cavity or the 3D shape with respect to the respective perpendicular planar paths, and wherein each pair of parallel planar resistive paths is matched in terms of their electrical resistance.

The two pairs of parallel resistive paths may form the side edges of a rectangle, with four contacts placed on the corners of the rectangle.

The sensor comprising a pyramid-shaped cavity or 3D shape may further comprise (i) two planar resistive paths in the vicinity of the cavity or the 3D shape, the two planar paths running along perpendicular lines in the plane of the main surface of the substrate; (ii) contacts at the start and end location of each planar resistive path, and terminals for accessing the contacts; (iii) a second cavity or 3D shape of the same shape as the first cavity or 3D shape, and placed in close proximity to the first cavity or 3D shape; (iv) four contacts placed around the second cavity or 3D shape, on the four corners of the second cavity or 3D shape, and terminals for allowing access to the corner contacts; and (v) four slanted resistive paths, each path running along the ribs of the second cavity or 3D shape, between the respective corner contacts and the tip area of the second cavity or 3D shape.

According to an embodiment, the substrate material is a crystalline semiconductor material, and the inclination angles are defined by the crystallographic structure of the material.

According to an embodiment, the sensor comprises multiple resistive paths obtained by implantation of dopant elements in narrow areas of the slanted surfaces, and, if applicable, in narrow areas of the main surface of the substrate or a surface parallel thereto, and wherein the sensor comprises resistive paths formed by implantation of dopant elements of a first polarity type, as well as resistive paths formed by implantation of dopant elements of a second polarity type, opposite to the first.

The disclosure is equally related to a semiconductor component comprising a stress sensor.

BRIEF DESCRIPTION OF THE FIGURES

The above, as well as additional, features will be better understood through the following illustrative and non-limiting detailed description of example embodiments, with reference to the appended drawings.

FIGS. 1a and 1b illustrate the principle of a sensor, including at least one slanted surface at an oblique angle relative to a main surface of a substrate, with a resistive path on the slanted surface, according to an example embodiment.

FIG. 2 illustrates a sensor comprising slanted surfaces having complementary angles relative to the main surface of the substrate, according to an example embodiment.

FIG. 4 also illustrates the orientation of the crystallographic axes and of the sensor axes for a sensor produced in a (100) silicon wafer.

FIG. 5 shows the sensor of FIG. 4, but without a contact at the bottom of the cavity.

Figure 3:
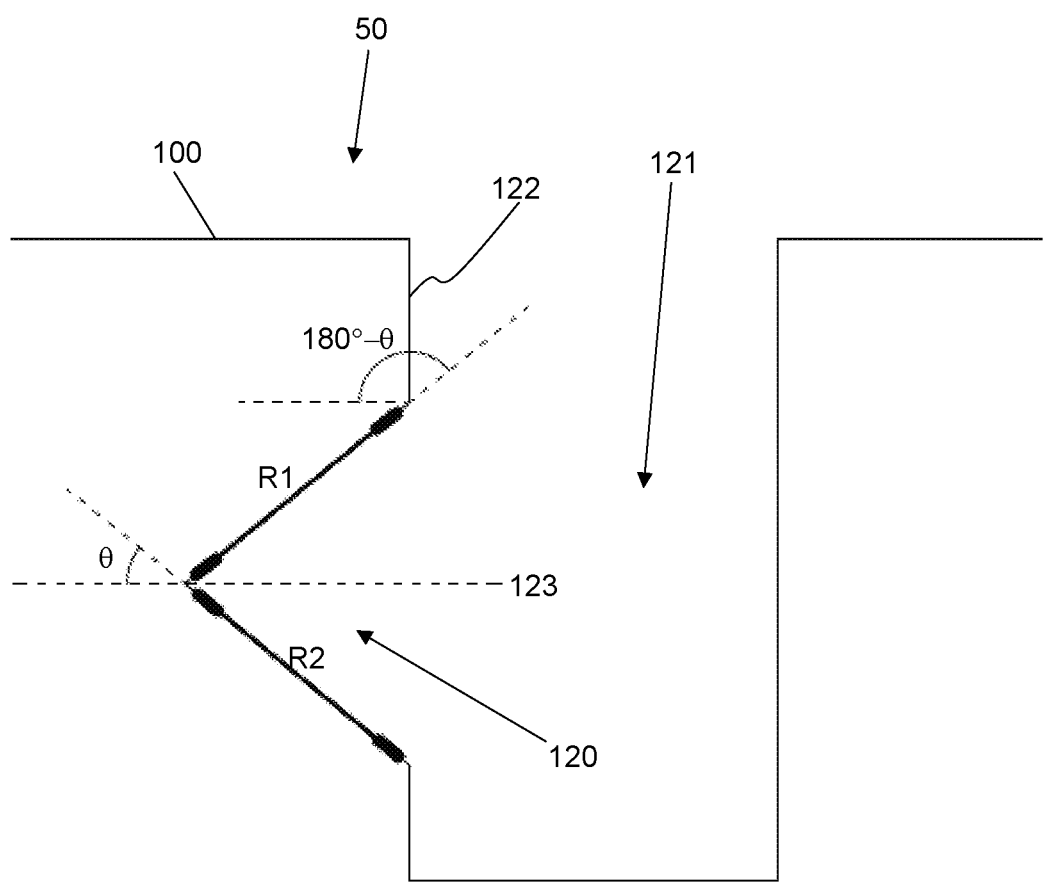
FIG. 3 illustrates a sensor wherein the slanted surfaces are formed in a vertical sidewall of a recess produced in the substrate, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings.

That which is encompassed by the claims may, however, be embodied in many different forms and should not be construed as limited to the embodiments set forth herein; rather, these embodiments are provided by way of example. Furthermore, like numbers refer to the same or similar elements or components throughout.

According to the disclosure, a stress sensor is formed on a semiconductor substrate having a planar main surface, wherein the sensor comprises at least one slanted surface of the substrate material, with 'slanted' meaning that the surface is a flat surface oriented at an oblique angle relative to the main surface, and on the slanted surface at least one resistive path. The semiconductor material may be a piezo-resistive material, including a piezo-resistive crystalline material, for example silicon, germanium or a compound semiconductor (e.g. GaAs). The path is slanted as a consequence of the oblique inclination angle of the surface. A 'resistive path' is defined within the present context as a portion of the surface that is equivalent to a one-dimensional conductor and which is thus characterized by a measurable electrical resistance. As the resistive path is one-dimensional, it has a well-defined inclination angle relative to the main surface of the substrate. The resistive path is thus straight relative to the slanted surface. Any oblique (i.e. different from 90°) inclination angle may be applied between the resistive path and the main surface of the substrate. In some embodiments, the angle is between 20° and 70°.

FIG. 1a shows an embodiment of a sensor comprising a substrate 50 with main surface 100 oriented horizontally and comprising a groove 101 having one slanted surface 102 defined by oblique angle θ relative to the main surface, with three resistive paths 103 to 105 on the slanted surface. One path would be enough but three are shown to illustrate different possible orientations of the paths. FIG. 1b shows an equivalent embodiment wherein a 3D shape 101' formed of the substrate material extends outwards from the main surface 100 of the substrate 50, the 3D shape having one slanted surface 102' with three resistive paths 103'-105' on the slanted surface. It is seen that the inclination angle of the paths may be equal to the inclination angle θ of the surface (paths 103 and 103') or differ from the angle θ (paths 104/105 and 104'/105'). In the embodiment shown, the paths extend between a first and second contact A and B (a contact may be provided only on one side of the path in specific embodiments, see further). The paths and contacts can be produced according to known techniques. The paths are produced by dopant implantation steps in narrow areas of the slanted surface. The contacts can be metal contacts formed in accordance with known semiconductor process technology.

Contacts A and B are accessible through electrical circuitry in the sensor (not shown) and through one or more terminals connected to the circuitry, in any manner known in the art of similar pressure sensors comprising resistive paths on the main surface of a substrate, of which examples are cited in the introductory paragraph. The sensor shown in FIG. 1a or 1b is distinguished from these sensors by the presence of a slanted resistive path. Through the contacts and terminals, the resistance of the paths can be measured. Changes in the resistance values are proportional to changes in the out-of-plane shear stress component in the vertical planes P1, P2, P3 perpendicular to the main surface. By monitoring the resistance of these paths, the sensor allows the monitoring of changes in the out-of-plane components of the shear stress occurring in the substrate in these planes. The actual measurement of the numerical value of the out-of-plane shear stress components defined in a particular 3-dimensional coordinate system requires the presence of additional sensors or additional resistive paths as will be described further in this description.

According to an embodiment illustrated in FIG. 2, a groove 110 is provided in the main surface 100 having two slanted surfaces 111 and 112 with complementary inclination angles θ and 180°-θ relative to the main surface 100. Or in other words, the two slanted surfaces are symmetrically opposed relative to a symmetry plane 113 that is perpendicular to the main surface 100. Two resistive paths R1,R2 are formed respectively on these slanted surfaces, so that the resistive paths also have complementary inclination angles relative to the main surface. The resistive paths R1, R2 are located in a plane that is not parallel to the main surface 100. The embodiment of FIG. 2 comprises several pairs R1, R2 which answer to that specification. The two resistors are located in the same plane. In the example shown, this plane is perpendicular to the main surface 100, but the paths R1,R2 may equally be located in a plane that is non-perpendicular and non-parallel relative to the main surface. Instead of on the slanted surfaces of a groove 110, the resistive paths R1,R2 may be formed on the slanted surfaces of a 3D-shape formed of the substrate material and extending outward from the main surface and having sidewalls with complementary inclination angles.

The grooves 101,110 described above are examples of cavities which are open to the main surface 100 of the substrate. The 3D shapes 101' described above are formed directly on the main surface. According to other embodiments, a groove is formed that is open to a surface that is not parallel to the main surface, or a 3D shape may be formed on such a surface. An example of such an embodiment is shown FIG. 3, where a groove 120 is formed in a sidewall of a recess 121 formed in the main surface 100 of the substrate 50. The groove 120 is thereby open to the sidewall surface 122. The resistive paths R1,R2 are again formed on the slanted surfaces which form the sidewalls of the groove 120. The slanted surfaces have complementary inclination angles θ and 180°-θ relative to the main surface 100. In this case, this means that the surfaces are symmetrically opposed relative to a horizontal symmetry plane 123. One way of producing the resistive paths in this case would be to deposit a doped oxide (e.g PSG; phosphosilicate glass) to fill the groove 120, then pattern it with an anisotropic etch featuring sufficient underlap so as to keep only the doped oxide near the buried path on which the resistive path is to be created. Finally, an anneal would allow the dopants contained in the doped oxide to transfer to the neighboring silicon, and then the remaining doped oxide can be removed isotropically (e.g wet etch).

A pair of resistive paths R1,R2 as described above, with well-defined complementary inclination angles relative to the main surface 100, allows to determine the numerical value of the out-of-plane shear stress component in the plane defined by the two paths R1,R2. This will be demonstrated for the specific case of a pyramid-shaped cavity, but the mathematics is the same for any of the pairs R1,R2 referred to above. According to particular embodiments, also illustrated hereafter, the resistors R1, R2 are matched, i.e. R1=R2.

Figure 4:
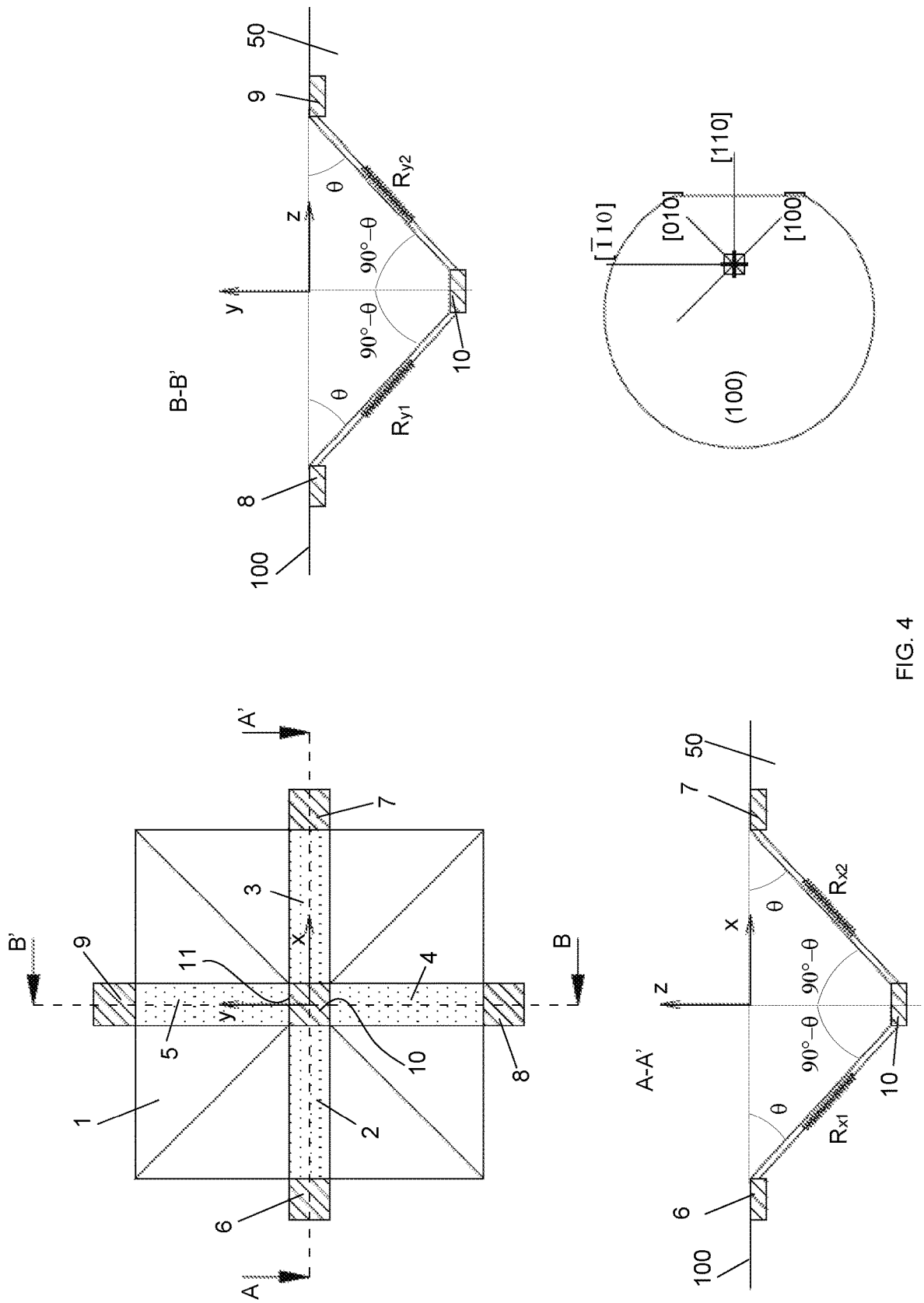
FIG. 4 shows a top view and cross section views of a stress sensor that allows a measurement of the out-of-plane stress components $\sigma_{xz}$ and $\sigma_{yz}$, according to an example embodiment.

FIG. 4 illustrates a sensor comprising a pyramid-shaped cavity 1 that is open to the main surface 100 of the substrate 50. The pyramid-shaped cavity 1 is produced by an anisotropic etch process, performed on a crystalline semiconductor wafer 50 with a pre-defined crystallographic orientation. Most silicon wafers used in the semiconductor industry have their flat surface oriented in the (100) plane of the silicon crystallographic structure. Such a configuration allows the production of a pyramid-shaped cavity by anisotropic wet etching, e.g. KOH-based, in a square portion of the wafer, the remainder being protected by a hardmask or resist layer. The etching process aligns on the crystallographic axes to thereby form a cavity with well-defined inclination angles of the cavity walls. The cavity may have dimensions in the order of nanometers; for example the sides of the pyramid's ground plane may be approximately 400 nm long.

In the sensor of FIG. 4, resistive paths 2,3,4,5 are created on the slanted walls of the cavity. This may be done by a dopant implantation step in the 4 path areas. For example a p-type dopant may be implanted to form the paths. The implant step can be done according to known techniques. The resistive paths extend between contacts 6,7,8,9 located in the middle of each of the four edges of the cavity to a central contact 10 in the tip area 11 of the cavity. The contact 10 is produced on a flat portion of the tip area, i.e. the inverted pyramid is in fact a flattened pyramid also known as a frustum of a pyramid, i.e. a pyramid with a top portion chopped off along a plane parallel to the ground plane. The four resistive paths 2 to 5 are equivalent to 4 resistors: two resistors $R_{x1}$ and $R_{x2}$ in the xz plane and two resistors $R_{y1}$ and $R_{y2}$ in the yz plane. The angle θ is known. Opposed slanted surfaces are symmetrical with respect to a plane perpendicular to the substrate 50, as expressed by the equal angles 90°-θ in both the xz plane and the yz plane. In the case of a cavity produced by wet etching in a crystallographic structure, the angle θ is defined by the crystallographic planes of the semiconductor material into which the pyramid has been created. The sensor further comprises terminals (not shown) on the exterior of the chip which are connected via circuitry within the chip to the respective contacts 6 to 10, so that each of these contacts can be individually accessed, for example for connecting them to a voltage source or to ground. According to an embodiment, one terminal is provided for each contact and individually connected to its respective contact. Alternatively the number of terminals may be lower than the number of contacts, and the measurements may be performed in a time-multiplexed manner.

In a coordinate system that is aligned with the crystallographic axes of a crystalline substrate material, the relation between the stress tensor in the substrate and the normalized resistance shifts in the direction of the stress components is the following:

$$\begin{pmatrix} \delta R_{xx} \\ \delta R_{yy} \\ \delta R_{zz} \\ \delta R_{yz} \\ \delta R_{xz} \\ \delta R_{xy} \end{pmatrix} = \begin{pmatrix} \pi_{11} & \pi_{12} & \pi_{12} & 0 & 0 & 0 \\ \pi_{12} & \pi_{11} & \pi_{12} & 0 & 0 & 0 \\ \pi_{12} & \pi_{12} & \pi_{11} & 0 & 0 & 0 \\ 0 & 0 & 0 & \pi_{44} & 0 & 0 \\ 0 & 0 & 0 & 0 & \pi_{44} & 0 \\ 0 & 0 & 0 & 0 & 0 & \pi_{44} \end{pmatrix} \cdot \begin{pmatrix} \sigma_{xx} \\ \sigma_{yy} \\ \sigma_{zz} \\ \sigma_{yz} \\ \sigma_{xz} \\ \sigma_{xy} \end{pmatrix} \quad \text{Equation (1)}$$

The normalized resistance shifts are defined as $\delta R_{ij} = \Delta R_{ij}/R_{ij}$ with $\Delta R_{ij}$ the actual shift in resistance value of a resistance $R_{ij}$. The coefficients $\pi_{11}$, $\pi_{12}$, and $\pi_{44}$ are temperature dependent piezo-resistive coefficients of the substrate material, as explained for the case of crystalline silicon in the above-identified document "Silicon piezoresistive stress sensors and their application in electronic packaging," by Suhling and Jaeger. The values of these coefficients are however dependent on the doping level and on temperature.

The x, y and z axes in FIG. 4 are normally not aligned with the crystallographic axes of the substrate material. The relation between the resistance shifts defined in x, y and z can however be determined on the basis of the equation (1) and the orientation of the axes x, y and z with respect to the crystallographic axes. For example, if the substrate is a (100) silicon substrate as illustrated in the insert in FIG. 4, the crystallographic axes in the plane of the wafer are oriented along the [100] and [010] directions. The cavity is produced according to these directions, hence the x and y directions of FIG. 4 correspond to the [110] and [1̄ 10] directions.

When a stress is applied to the substrate onto which the sensor of FIG. 4 is built, at a time when the substrate is in a theoretical 'zero-stress' condition, the resistances $R_{x1}$ and $R_{x2}$ shift over values $\Delta R_{x1}$ and $\Delta R_{x2}$. The relation between the normalized shifts is: $\delta R_{x1} = \Delta R_{x1}/R_{x1}$ and $\delta R_{x2} = \Delta R_{x2}/R_{x2}$ The shifts along the axes xyz is given by the Mohr transformation, which is known for characterizing a rotation about one of the principal axes. In addition, the resistance shift depends on a possible temperature increase $\Delta T$, through the temperature coefficient $\alpha$ of the substrate material. The following relations are therefore valid:

$$\delta R_{x1} = \delta R_{xx} \cdot \cos^2\theta + \delta R_{zz} \cdot \sin^2\theta + \delta R_{xz} \cdot \sin 2\theta + \alpha \cdot \Delta T \quad \text{Equation (2)}$$

$$\delta R_{x2} = \delta R_{xx} \cdot \cos^2\theta + \delta R_{zz} \cdot \sin^2\theta - \delta R_{xz} \cdot \sin 2\theta + \alpha \cdot \Delta T \quad \text{Equation (3)}$$

The difference between equations (2) and (3) yields:

$$\delta R_{x1} - \delta R_{x2} = 2 \cdot \delta R_{xz} \cdot \sin 2\theta \quad \text{Equation (4)}$$

As $\delta R_{xz}$ equals $\pi_{44} \cdot \sigma_{xz}$ (from equation (1), which is valid in xyz as the z-axis is still oriented according to a crystallographic axis) with $\pi_{44}$ a value known from literature or from a previous calibration, the measurement of $\delta R_{x1} - \delta R_{x2}$ directly delivers a value for the out-of-plane stress component $\sigma_{xz}$:

$$\sigma_{xz} = \delta R_{xz}/\pi_{44} \text{ with } \delta R_{xz} = (\delta R_{x1} - \delta R_{x2})/(2 \cdot \sin 2\theta) \quad \text{Equation (5)}$$

The same reasoning applies for the second out-of-plane component $\sigma yz$:

$$\sigma_{yz} = \delta R_{yz}/\pi_{44} \text{ with } \delta R_{yz} = (\delta R_{y1} - \delta R_{y2})/(2 \cdot \sin 2\theta) \quad \text{Equation (6)}$$

The measurement of the resistance shifts may be done by applying a known voltage difference between the central contact 10 and the respective side contacts 6 to 9 of the sensor, and measuring the current. This is done once for a reference condition chosen to closely approximate the theoretical zero stress condition. The measurement of stress is therefore a relative measurement of the stress with respect to the reference condition. Such a stress measurement then entails the measurement of the resistance values under test conditions. The values of $\Delta R_{x1}$, $\Delta R_{x2}$, $\Delta R_{y1}$ and $\Delta R_{y2}$ are calculated as the difference between the measured resistances and the resistances obtained at the reference condition. In some embodiments, the opposing slanted resistive paths are matched at the reference condition, i.e. $R_{x1} = R_{x2} = R_{0x}$ and $R_{y1} = R_{y2} = R_{0y}$ at the reference condition. In that case the following is true:

$$\delta R_{x1} - \delta R_{x2} = [(R_{x1} - R_{x0})/R_{x0}] - [(R_{x2} - R_{x0})/R_{x0}] = (1/R_{x0})(R_{x1} - R_{x2}).$$

The measurement of the difference between $R_{x1}$ and $R_{x2}$ combined with the knowledge of $R_{x0}$ is then sufficient to calculate $\sigma_{xz}$. The resistances in the yz plane are also matched.

A second embodiment is shown in FIG. 5. In this embodiment, the bottom contact is absent, and the resistive paths 2 to 5 extend between the contacts 6 to 9 and the central tip area 11 of the inverted pyramid, where the resistive paths merge to form a node between the two pairs of conductors 2+3 and 4+5, i.e. the tip area 11 is part of two intersecting conductive paths 2+3 and 4+5. In this case the shape of the cavity may be a frustum of a pyramid or it may be an actual inverted pyramid with a tip. The measurement of the out-of-plane stress components $\sigma_{xz}$ and $\sigma_y z$ is possible with the sensor of FIG. 5, provided that the opposite slanted resistive paths are matched at the reference condition, i.e. $R_{x1} = R_{x2} = R_{0x}$ and $R_{y1} = R_{y2} = R_{0y}$.

Figure 6A:
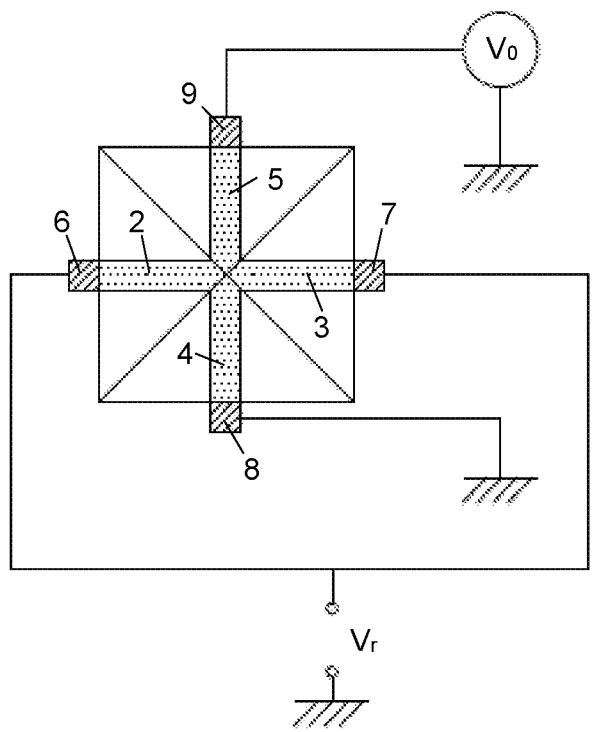
FIGS. 6a and 6b illustrate how to measure the out-of-plane resistance shift in a stress sensor according to FIG. 5.

One way of measuring $\delta R_{x1} - \delta R_{x2}$ with this sensor is illustrated in FIG. 6a. The measured voltage of this measurement setup is $V_r$:

$$V_r = V_0 * R_{x1}/(R_{x1} + R_{x2})$$

At zero stress, $R_{x1} = R_{x2} = R_{0x}$ because of the matched condition. When stress is applied, a small variation of the resistances $R_{x1}$ and $R_{x2}$ is generated. Therefore, $R_{x1}$ becomes $R_{0x} + \Delta R_{x1}$ and $R_{x2}$ becomes $R_{0x} + \Delta R_{x2}$. The small variation of $V_r$ created by the stress is a differentiation of the expression of $V_r$:

$$\Delta V_r = V_0 * ((R_{x1}(0) + R_{x2}(0))\Delta R_{x1} - R_{x1}(0)\Delta(R_{x1} + R_{x2}))/((R_{x1}(0) + R_{x2}(0))^2)$$

Replacing $R_{x1}(0)$ and $R_{x2}(0)$ by $R_{0x}$ yields the following expression:

$$\Delta V_r = V_0 * (2R_{0x}\Delta R_{x1} - R_{0x}\Delta(R_{x1} + R_{x2}))/((2R_{0x})^2)$$

Hence the final expression:

$$\Delta V_r = V_0 * (\Delta R_{x1} - \Delta R_{x2})/(4R_0) = V_0 * (\delta R_{x1} - \delta_{x2})/4$$

Figure 6B:
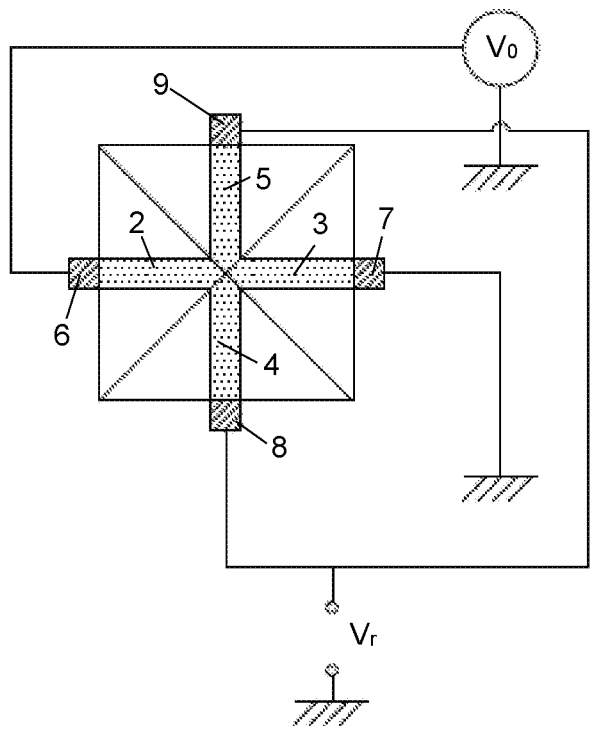

This allows for the determination of $\delta R_{x1} - \delta R_{x2}$ from the measurement of $\Delta V_r$. FIG. 6b illustrates the analogue setup for measuring $\delta R_{y1} - \delta R_{y2}$.

Figure 7:
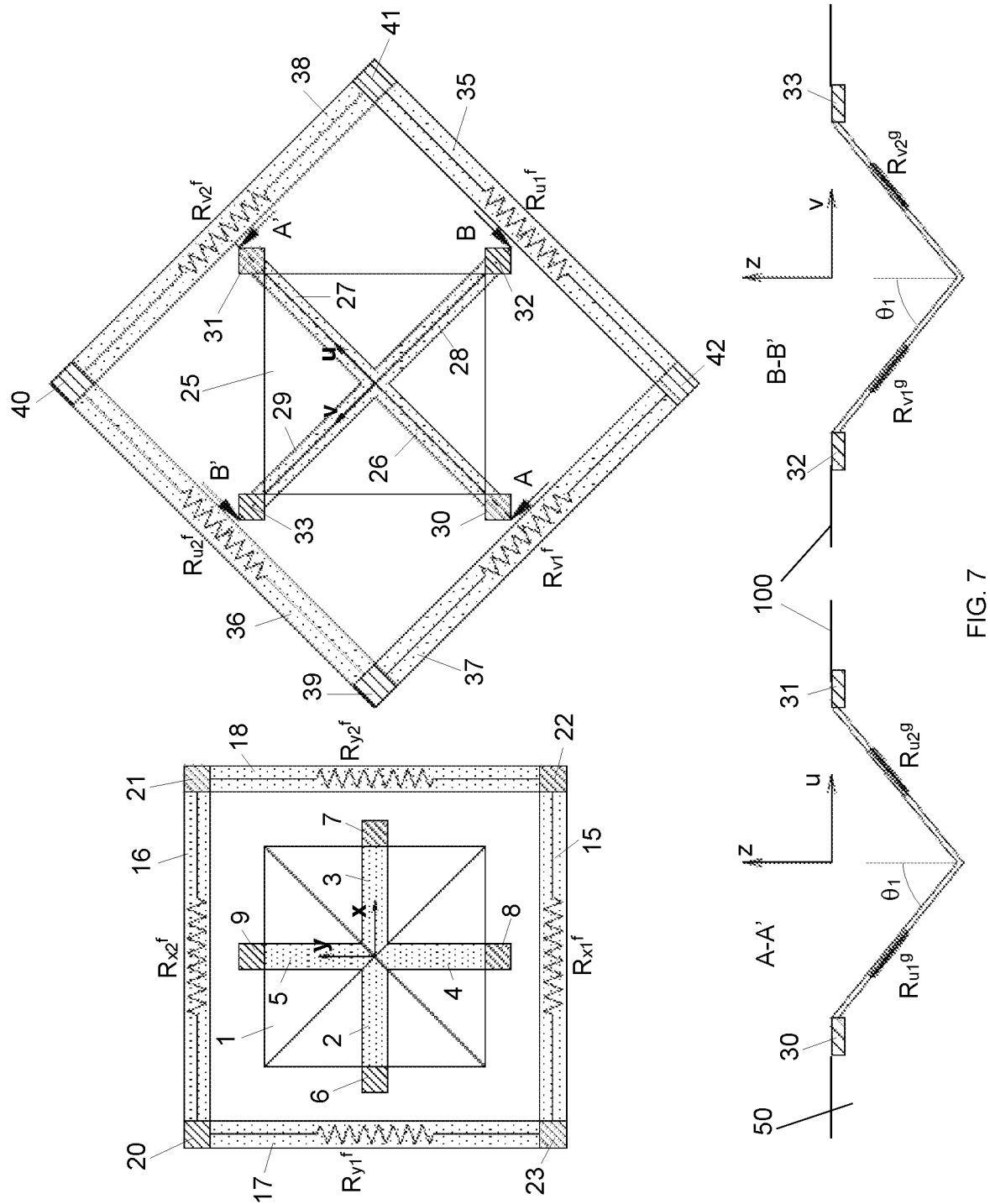
FIG. 7 illustrates a sensor design configured to measure all stress components in a temperature compensated way, according to an example embodiment.

An example embodiment of a stress sensor is configured to measure not only the out-of-plane shear stress components $\sigma_{xz}$ and $\sigma_y z$ but additionally the normal stress components $\sigma_{xx}$, $\sigma_{yy}$ and $\sigma_{zz}$ in a temperature-compensated way. A first possible realization of this embodiment is shown in FIG. 7. The sensor comprises additional planar resistive paths 15 to 18 in the vicinity of the inverted pyramid-shaped cavity 1, term 'planar path' distinguishing these paths from the 'slanted paths', and indicating that the resistive paths are parallel to the plane of the main surface 100 of the substrate 50. In some embodiments, the planar paths are located on the main surface 100. These paths are obtainable by implanting dopants in delimited areas of the substrate surface 100, in a manner known in the art, for example for the production of currently known stress sensors referred to in the introductory section. Each path is equivalent to a planar resistor. The embodiment of FIG. 7 has a symmetrical layout, with planar resistors $R_{x1}{}^f$ and $R_{x2}{}^f$ placed on opposite sides of the pyramid and oriented in the x-direction, and planar resistors $R_{y1}{}^f$ and $R_{y2}{}^f$ placed on opposite sides of the pyramid and oriented in the y-direction. The planar resistors are matched: $R_{x1}{}^f = R_{x2}{}^f$ and $R_{y1}{}^f = R_{y2}{}^f$. The four planar resistors are accessible through four contacts 20 to 23, i.e. the planar resistors form a rectangle with the four contacts placed on the corners. The slanted resistors already described in relation to FIGS. 4 to 6 are now named $R_{x1}{}^g$, $R_{x2}{}^g$, $R_{y1}{}^g$ and $R_{y2}{}^g$ to distinguish them from the planar resistors. The slanted resistors are matched, i.e. $R_{x1}{}^g = R_{x2}{}^g$ and $R_{y1}{}^g = R_{y2}{}^g$. In this embodiment, there is no contact at the bottom of the pyramid (but it could be present according to an alternative embodiment).

In addition, a second pyramid-shaped cavity 25 is provided in close proximity to the first cavity 1 so that the stress state of the substrate is essentially the same at the locations of the two cavities 1 and 25. The second pyramid 25 has slanted resistive paths 26 to 29 along the ribs of the pyramid, equivalent to resistors $R_{u1}{}^g$, $R_{u2}{}^g$, $R_{v1}{}^g$ and $R_{v2}{}^g$. These latter resistors are located in the uz and vz planes of a rotated axis system uvz, which is rotated 45° about the z-axis with respect to x and y. These resistors are equally matched: $R_{u1}{}^g = R_{u2}{}^g$ and $R_{v1}{}^g = R_{v2}{}^g$. Contacts 30 to 33 are provided on the four corners of the cavity 25, connected to terminals (not shown) for accessing these contacts individually. In addition, matched planar resistive paths 35 to 38 are produced along the u and v directions, equivalent respectively to four planar resistors: $R_{u1}{}^f = R_{u2}{}^f$ and $R_{v1}{}^f = R_{v2}{}^f$. Four contacts 39-42 are provided so that the planar paths 35-38 form a rectangle with the contacts 39-42 at the four corners.

On the basis of resistance measurements performed on this sensor design, it is possible to derive three independent and temperature-compensated equations, from which to solve $\sigma_{xx}$, $\sigma_{yy}$ and $\sigma_{zz}$. The normalized shift of the sum $R_{x1}{}^g + R_{x2}{}^g$ is defined as $\delta R_{xx}{}^g$:

$$\delta R_{xx}{}^g = (\Delta R_{x1}{}^g + \Delta R_{x2}{}^g)/(R_{x1}{}^g + R_{x2}{}^g) \quad \text{Equation (7)}$$

Due to the matching of the slanted resistances, this can be written as:

$$\delta R_{xx}{}^g = \delta R_{x1}{}^g/2 + \delta R_{x2}{}^g/2 \quad \text{Equation (8)}$$

Taking into account equations (2) and (3), this can further be written as:

$$\delta R_{xx}{}^g = \tfrac{1}{2} \cdot (\delta R_{xx} \cdot \cos^2\theta + \delta R_{zz} \cdot \sin^2\theta + \alpha \cdot \Delta T) \quad \text{Equation (9)}$$

$\delta R_{xx}$ and $\delta R_{zz}$ can be written as a function of the stress components on the basis of the piezo-resistive matrix. This relation depends on the orientation of the first pyramid 1 with respect to the crystallographic axes of the substrate. In the case of a (100) silicon substrate, wherein the x-axis is oriented in the [110] direction (see FIG. 4), this relation is:

$$\delta R_{xx} = \pi_L \sigma_{xx} + \pi_T \sigma_{yy} + \pi_{12}\sigma_{zz} + \alpha\Delta T \quad \text{Equation (10)}$$

$$\delta R_{zz} = \pi_{12}\sigma_{xx} + \pi_{12}\sigma_{yy} + \pi_{11}\sigma_{zz} + \alpha\Delta T \quad \text{Equation (11)}$$

with:

$$\pi_L = \frac{\pi_{11} + \pi_{12} + \pi_{44}}{2} \quad \text{and}$$

$$\pi_T = \frac{\pi_{11} + \pi_{12} - \pi_{44}}{2}$$

Reference is again made to the Suhling and Jaeger article referred to above for more details about how these formulas are obtained. The substitution of formulas (10) and (11) in formula (9) results in the following relation:

$$\delta R_{xx}{}^g = A_g \sigma_{xx} + B_g \sigma_{yy} + C_g \sigma_{zz} + \alpha \cdot \Delta T \quad \text{Equation (12)}$$

For symmetry reasons, $\delta R_{yy}{}^g$ can be written as follows:

$$\delta R_{yy}{}^g = B_g \sigma_{xx} + A_g \sigma_{yy} + C_g \sigma_{zz} + \alpha \cdot \Delta T \quad \text{Equation (13)}$$

The normalized shifts of the planar resistors can be directly derived from the piezo-resistive matrix:

$$\delta R_{xx}{}^f = \delta R_{xx} = \pi_L \sigma_{xx} + \pi_T \sigma_{yy} + \pi_{12}\sigma_{zz} + \alpha\Delta T \quad \text{Equation (14)}$$

$$\delta R_{yy}{}^f = R_{yy} = \pi_T \sigma_{xx} + \pi_L \sigma_{yy} + \pi_{12}\sigma_{zz} + \alpha\Delta T \quad \text{Equation (15)}$$

In the embodiment of FIG. 7, the resistances $R_{xx}{}^f$ and $R_{yy}{}^f$ can be defined as:

$$R_{xx}{}^f = R_{x1}{}^f + R_{x2}{}^f,$$

$$R_{yy}{}^f = R_{y1}{}^f + R_{y2}{}^f$$

As the parallel flat resistors are matched ($R_{x1}{}^f = R_{x2}{}^f$ and $R_{y1}{}^f = R_{y2}{}^f$), the following relations hold:

$$\delta R_{xx}{}^f = \delta R_{x1}{}^f/2 + \delta R_{x2}{}^f/2$$

$$\delta R_{yy}{}^f = \delta R_{y1}{}^f/2 + \delta R_{y2}{}^f/2$$

Alternatively, only one of the two flat resistors in each direction could be taken into consideration, for example:

$$R_{xx} = R_{x1}{}^f$$

$$R_{yy} = R_{y1}{}^f$$

In practice, however, the stress and temperature and the resistance parameters will not be constant but may vary with a certain gradient across the wafer. Using the sum of two matched resistances symmetric with respect to the center of the structure instead of measuring either one of them individually allows for the cancellation of some imperfections of the structure to the first order.

Equations (12) to (15) together form a system of four equations:

$$\begin{pmatrix} A_f & B_f & C_f & \alpha \\ B_f & A_f & C_f & \alpha \\ A_g & B_g & C_g & \alpha \\ B_g & A_g & C_g & \alpha \end{pmatrix} \cdot \begin{pmatrix} \sigma_{xx} \\ \sigma_{yy} \\ \sigma_{zz} \\ T \end{pmatrix} = \begin{pmatrix} \delta R_{xx}^f \\ \delta R_{yy}^f \\ \delta R_{xx}^g \\ \delta R_{yy}^g \end{pmatrix} \quad \text{Equation (16)}$$

The coefficients $A_f$, $B_f$, $C_f$, $A_g$, $B_g$ and $C_g$ can be calculated on the basis of the above-described formulas. Alternatively, the coefficients can be obtained by a calibration. Known calibration techniques can be employed wherein pre-defined stress components are applied. For in-plane normal stress components ($\sigma_{xx}$ and $\sigma_{yy}$), a 4 point bending tool can be used, as well-known in the art. Although the 4 point bending cannot create shear stress alone ($\sigma_{xy}$), it is possible to use a rotated die (rotated about the z-axis) where the 4 point bending system will create all components ($\sigma_{xx}$, $\sigma_{yy}$, and $\sigma_{xy}$), in the coordinate system of the sensor (i.e. x and y refer here to the sensor axes and not the 4 pt bending tool axes). But the contributions from ($\sigma_{xx}$, $\sigma_{yy}$) can be determined thanks to the first set of calibrations, which allows to extract the sensitivity to $\sigma_{xy}$. For $\sigma_{zz}$, a nano-indenter tool can be used, as described for example in document "Towards piezo-resistive CMOS sensors for out-of-plane stress", Lemke et al, Proceedings, IEEE 22nd International Conference on Micro Electro Mechanical Systems, March 2009. Finally, for $\sigma_{xz}$ and $\sigma_{yz}$, a microbump can be processed on top of the sensor and a shear test of the microbump can apply either $\sigma_{xz}$ and $\sigma_{yz}$.

The 4×4 matrix in the system of equations (16) is a singular matrix, so the system cannot be solved unless one additional equation is provided. The following two equations are directly derived from the system (16):

$$\delta R_{xx}{}^f - \delta R_{xx}{}^g = (A_f - A_g)\sigma_{xx} + (B_f - B_g)\sigma_{yy} + (C_f - C_g)\sigma_{zz} \quad \text{Equation (17)}$$

$$(\delta R_{xx}{}^f + \delta R_{yy}{}^f) - (\delta R_{xx}{}^g + \delta R_{yy}{}^g) = (A_f + B_f - A_g - B_g)(\sigma_{xx} + \sigma_{yy}) + 2(C_f - C_g)\sigma_{zz} \quad \text{Equation (18)}$$

A third equation is obtained on the basis of the resistors oriented in the u and v directions in the second pyramid 25. $R_u{}^g$ is defined as $R_{u1}{}^g + R_{u2}{}^g$ and $R_v{}^g$ is defined as $R_{v1}{}^g + R_{v2}{}^g$. For symmetry reasons, the sum $R_u{}^g + R_v{}^g$ has the following sensitivity to stress:

$$\delta(R_u{}^g + R_v{}^g) = \delta R_{uv}{}^g = Dg \cdot (\sigma_{xx} + \sigma_{yy}) + Eg \cdot \sigma_{zz} \quad \text{Equation (19)}$$

Again for symmetry reasons, and with $R_u{}^f = R_{u1}{}^f + R_{u2}{}^f$ and $R_v{}^f = R_{v1}{}^f + R_{v2}{}^f$, the following relation holds:

$$\delta(R_u{}^f + R_v{}^f) = \delta R_{uv}{}^f = Df \cdot (\sigma_{xx} + \sigma_{yy}) + Ef \cdot \sigma_{zz} \quad \text{Equation (20)}$$

The coefficients Dg, Eg, Df and Ef can be determined by calibration or calculated as follows:

$$Ef=\pi_{11}$$

$$Df=(\pi_{11}+\pi_{12})/2$$

$$Eg=(\pi_{12}\cos^2\theta1+\pi_{11}\sin^2\theta1)$$

$$Dg=((\pi_{11}+\pi_{12})/2)\cos^2\theta1+\pi_{12}\sin^2\theta1$$

In these calculations, θ1 is the angle of the edges of the ribs of the pyramid 25 with respect to the axis z (see FIG. 4).

The difference between equations (19) and (20) yields:

$$\delta R_{uv}{}^g - \delta R_{uv}{}^f = (D_g - D_f)(\sigma_{xx} + \sigma_{yy}) + (E_g - E_f)\sigma_{zz} \quad \text{Equation (21)}$$

Figure 8:
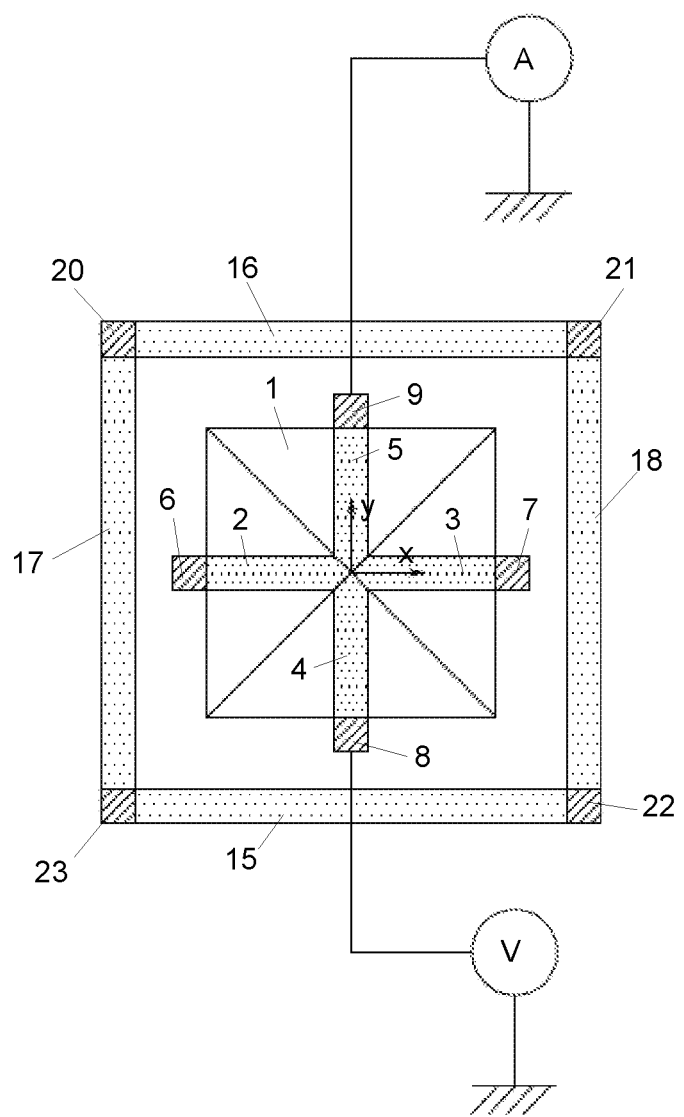
FIG. 8 shows a measurement setup for measuring a resistance shift in a sensor according to FIG. 6 or 7.

From the linearly independent equations (17), (18) and (21), the stress components $\sigma_{xx}$, $\sigma_{yy}$ and $\sigma_{zz}$ can then be calculated, after a measurement of $\delta R_{xx}{}^f$, $\delta R_{xx}{}^g$, $\delta R_{yy}{}^f$, $\delta R_{yy}{}^g$, $\delta R_{uv}{}^g$ and $\delta R_{uv}{}^f$. The measurements of these resistance shifts can be done by measuring the respective resistances by coupling the relevant contacts to a voltage source and measuring the resulting current, as illustrated in FIG. 8 for the case of measuring $R_{yy}{}^g$. The δ-values can be obtained by subtracting the known resistance value at the reference condition close to the theoretical zero-stress condition, from the measured value. The known resistances at the reference condition can be obtained from a calibration measurement. In some embodiments, additional matching may simplify the measurements. For example, according to an example embodiment, the resistances $R_{xx}{}^g$ and $R_{xx}{}^f$ are matched, i.e. $R_{xx}{}^g = R_{x1}{}^g + R_{x2}{}^g = R_{xx}{}^f = R_{x1}{}^f + R_{x2}{}^f = R_{x0}$ at the reference condition. In this case, the left hand side of equation (17) can be found from a measurement of $R_{xx}{}^f - R_{xx}{}^g$ and the knowledge of $R_{x0}$.

The embodiment of FIG. 7 further allows for the measurement of a xy from the planar resistances arranged in a rectangular pattern with four contacts 20-23 at the corners of the rectangle. This is the known design of a pseudo-Hall sensor, allowing for the measurement of $\sigma_{xy}$ directly. The pseudo-Hall sensor is described for example in "A novel stress sensor based on the transverse pseudo-Hall effect of MOSFETs,", M. Doelle et al, Micro Electro Mechanical Systems, 2003. MEMS-03 Kyoto. IEEE The Sixteenth Annual International Conference on, 2003, pp. 490-493. The sensor of FIG. 7 thus allows for the measurement of all six components of the stress tensor.

In FIG. 7, the resistive paths 35-38 could be omitted. The values of $R_{u1}{}^f$, $R_{u2}{}^f$, $R_{v1}{}^f$ and $R_{v2}{}^f$ can also be derived from $R_{x1}{}^f$, $R_{x2}{}^f$, $R_{y1}{}^f$ and $R_{y2}{}^f$ taking into account the orientation of u and v with respect to x and y and taking into account the piezo-resistive matrix. This calculation is explained for example in the Suhling and Jaeger article referred to above.

Figure 9:
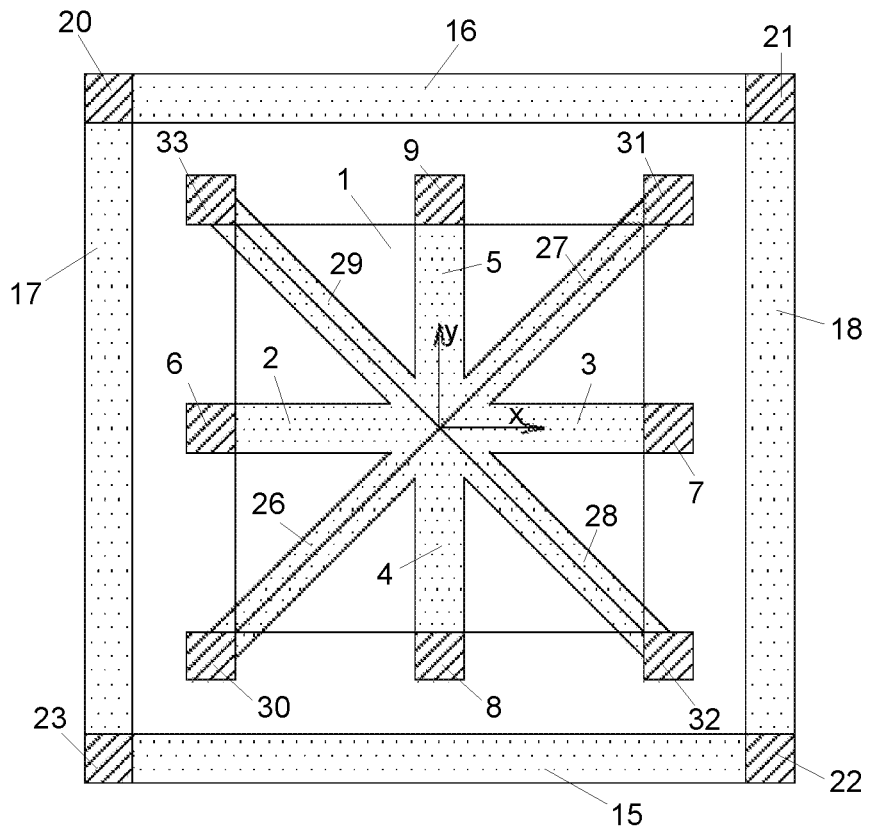
FIG. 9 shows a compact sensor design configured to measure all stress components in a temperature compensated way.

FIG. 9 shows another embodiment, comprising a single cavity 1, and wherein slanted resistive paths 2 to 5 and 26 to 29 as described above are formed both along the sidewalls of the cavity and along the ribs, with 8 contacts formed around the cavity: four contacts 6 to 9 in the middle of the cavity's edges and four additional contacts 30 to 33 on the corners of the cavity. The four planar resistors 15 to 18 arranged in a rectangle are equally present in this embodiment. The values of planar resistors $R_{u1}{}^f$, $R_{u2}{}^f$, $R_{v1}{}^f$ and $R_{v2}{}^f$ in the u and v directions can be calculated from the planar resistors in the x and y directions, taking into account the known orientation of u and v with respect to x and y and the piezo-resistive matrix. Alternatively, four additional planar resistors arranged in the u and v directions can be added to the design of FIG. 9, allowing the direct measurement of $R_{u1}{}^f$, $R_{u2}{}^f$, $R_{v1}{}^f$ and $R_{v2}{}^f$. $\sigma_{xy}$ can be obtained by using the planar rectangle oriented along the x and y axes as a pseudo-Hall sensor. In this way, the sensor of FIG. 9 is a more compact version of a sensor according to the disclosure that allows for the measurement of all six stress components.

Figure 10:
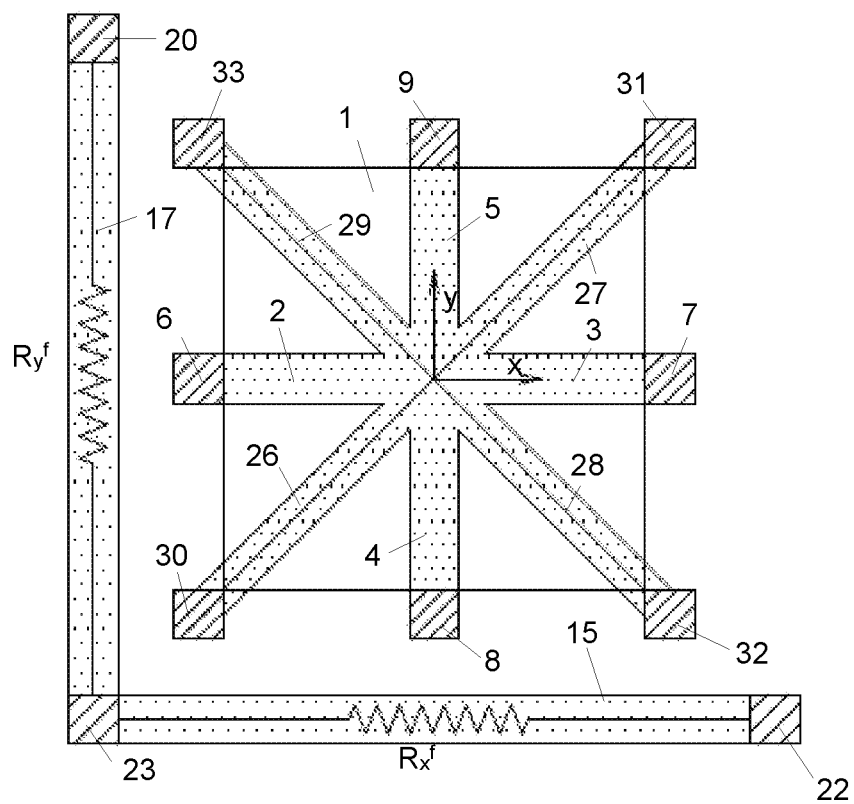
FIG. 10 shows another possible sensor design, according to an example embodiment.

FIG. 10 shows another alternative, comprising only one planar resistor $R_x{}^f$ in the x-direction and one planar resistor $R_y{}^f$ in the y direction. A stated above, the presence of matched planar resistors on opposite sides of the pyramid is not required for determining the system of equations (17) (18)(21). So the sensor of FIG. 10 is capable of sensing the stress components $\sigma_{xz}$, $\sigma_{yz}$, $\sigma_{xx}$, $\sigma_{yy}$ and $\sigma_{zz}$. The in-plane shear stress $\sigma_{xy}$ cannot be measured by this sensor.

Figure 11:
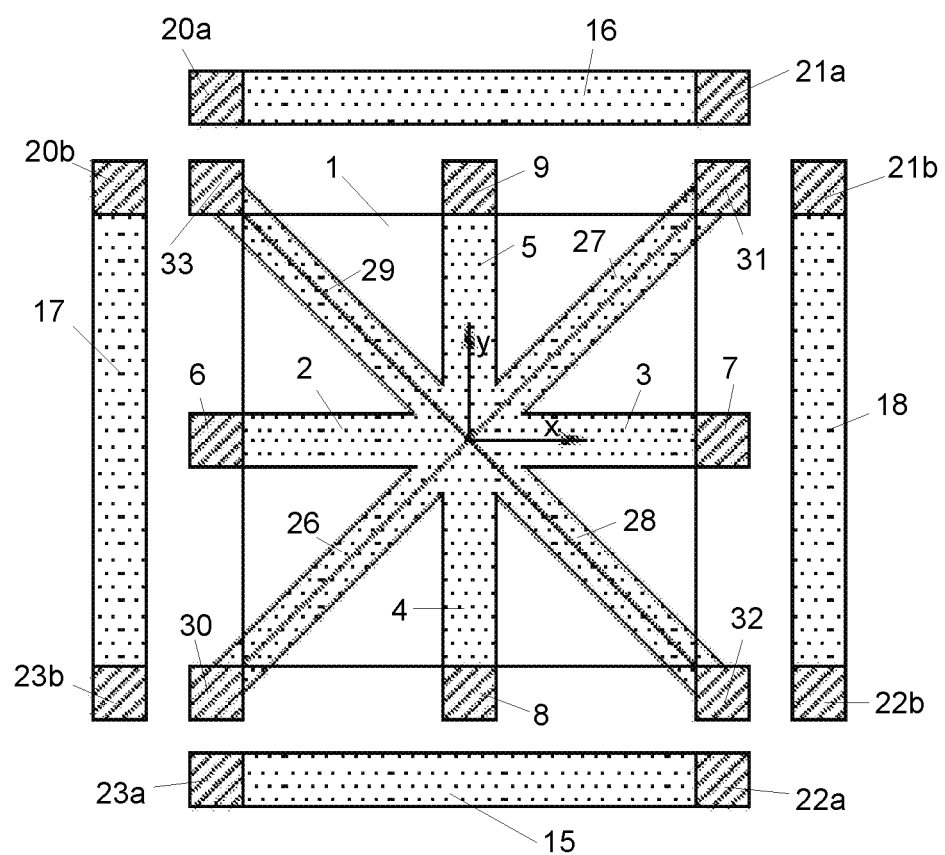
FIG. 11 shows a sensor design with separate planar resistive paths around a pyramid-shaped cavity, according an example embodiment.

FIG. 11 shows another variation that allows for the measurement of all stress components apart from $\sigma_{xy}$. It is seen that the planar resistive paths 15 to 18 do not form a closed rectangle in this embodiment, but are formed of separated resistive paths, each having a pair of dedicated contacts 20*a*/21*a*; 20*b*/23*b*; 21*b*/22*b*; 23*a*/22*a*.

Figure 12:
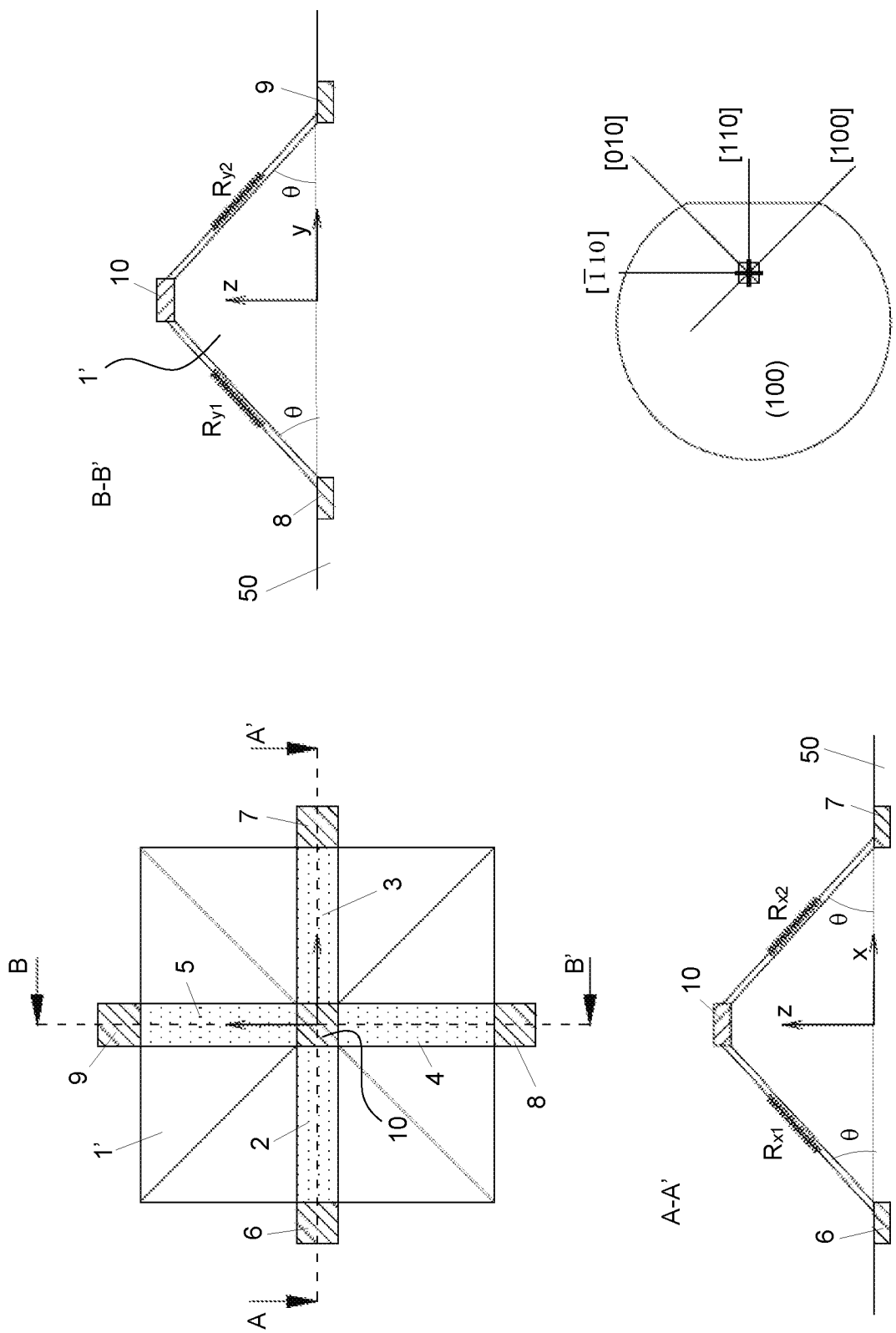
FIG. 12 illustrates a sensor provided with a 3D pyramid extending outward from the substrate, according to an example embodiment.

The disclosure is not limited to embodiments which include a pyramid-shaped cavity. The same equations can be derived from a positive pyramid 1' extending outward from the surface of the substrate 50 and formed of the substrate material, as illustrated in FIG. 12. The pyramid 1' is the 'positive' of the cavity shown in FIG. 4. What is important is that the angle θ of inclination of the pyramid's sidewalls is known and that resistive paths are produced on the sidewalls, combined with planar resistive paths in the vicinity of the pyramid. A positive pyramid can be obtained by etching two adjacent V-shaped grooves, in two orthogonal directions. All the above-described embodiments are valid when the pyramid-shaped cavities 1 and 25 are replaced by such positive pyramids. The only difference is that the angle θ in the above-described equations is to be replaced by −θ.

Figure 13A:
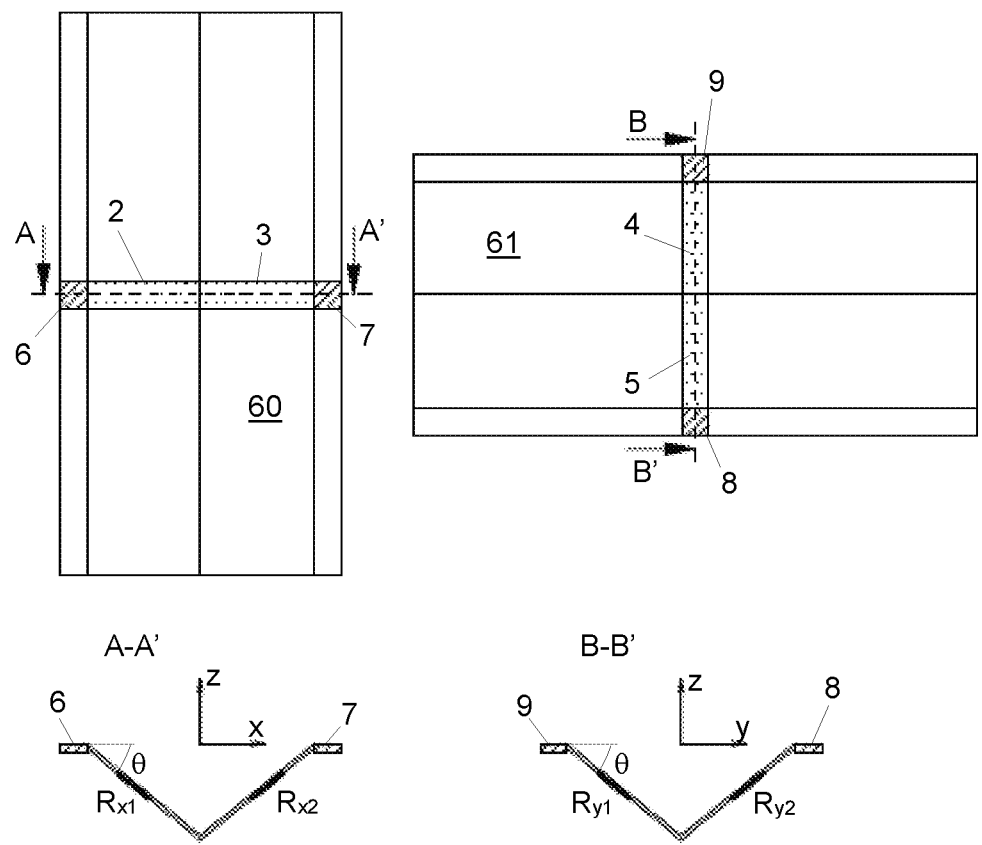
FIGS. 13a and 13b show a sensor comprising a set of two V-shaped grooves oriented at 90°, according to an example embodiment.

Another alternative is illustrated in FIG. 13*a*. This sensor comprises two mutually perpendicular V-shaped grooves 60 and 61, with resistive paths 2,3,4 and 5 along the sidewalls of the grooves and contacts 6,7,8,9 for accessing the resistive paths. The corresponding resistances are indicated also in FIG. 13*a*. A contact could furthermore be present at the bottom of the grooves, but when this is not the case as in the embodiment shown in FIG. 13*a*, the slanted paths have matched resistances: $R_{x1}=R_{x2}$ and $R_{y1}=R_{y2}$. With the angle θ known, it is clear that this sensor design is equivalent to the design of FIG. 5 in terms of determining the out-of-plane shear stress components $\sigma_{xz}$ and $\sigma_{yz}$. Instead of the two grooves of FIG. 13*a*, two mutually perpendicular prisms extending outward from the substrate, with triangular cross-sections identical to the cross-sections of the grooves 60 and 61 can be produced on the surface of the substrate, with resistive paths on the slanted sidewalls of the prisms.

Figure 13B:
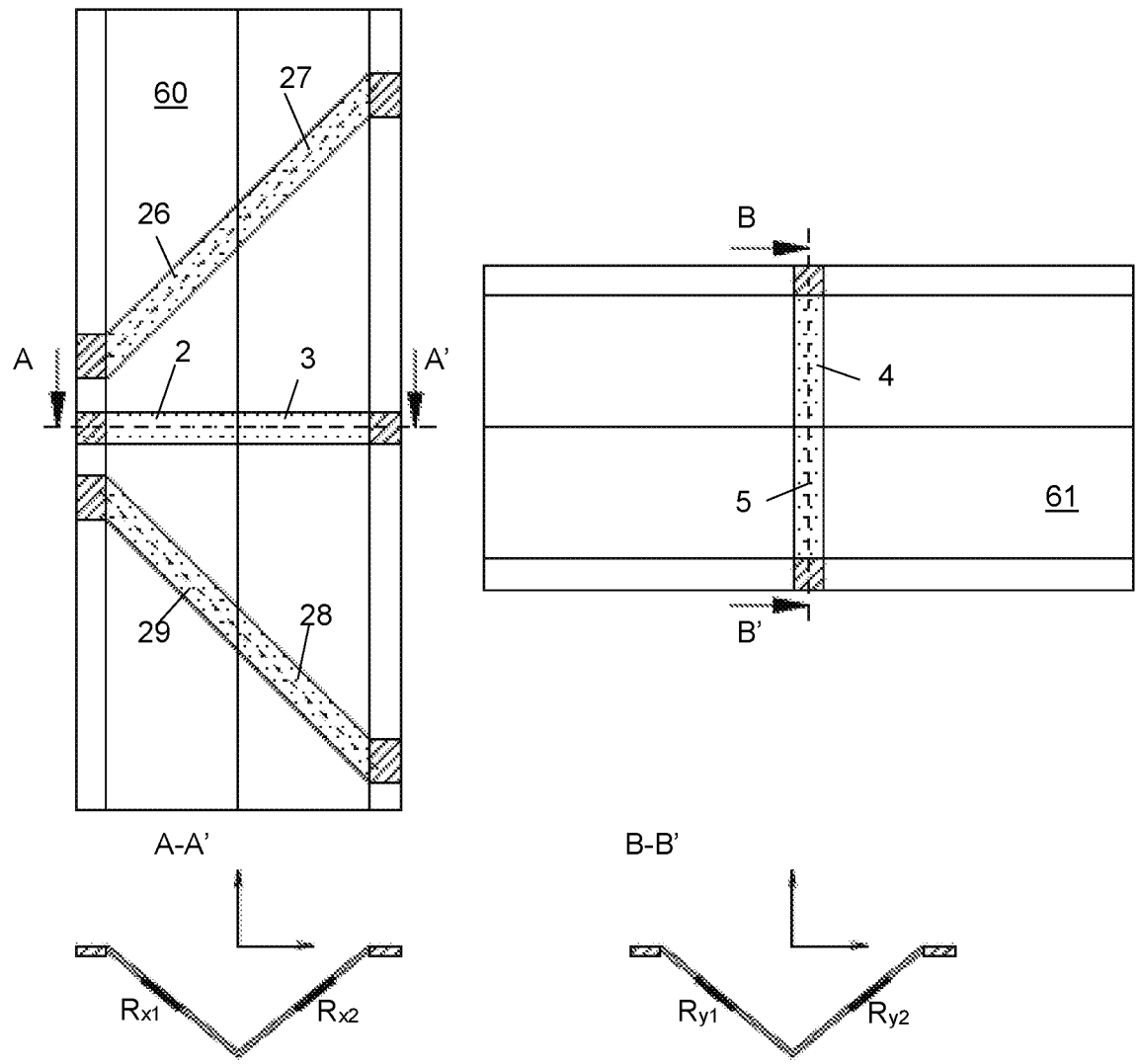

In FIG. 13*b*, the same grooves are shown, but the first one further comprises slanted resistive paths oriented at 45° relative to the paths 2 and 3, as seen in the projection on a horizontal plane (i.e. the plane of the drawing). The pairs of slanted resistors 26,27 and 28,29 are in fact equivalent to the paths referenced by the same numbers and shown in FIGS. 7 and 9 to 11, namely the paths oriented along the ribs of the pyramid-shaped cavity. By adding planar resistors to the design of FIG. 13*b*, a sensor may therefore be obtained that is capable of measuring all six stress components.

Figure 14:
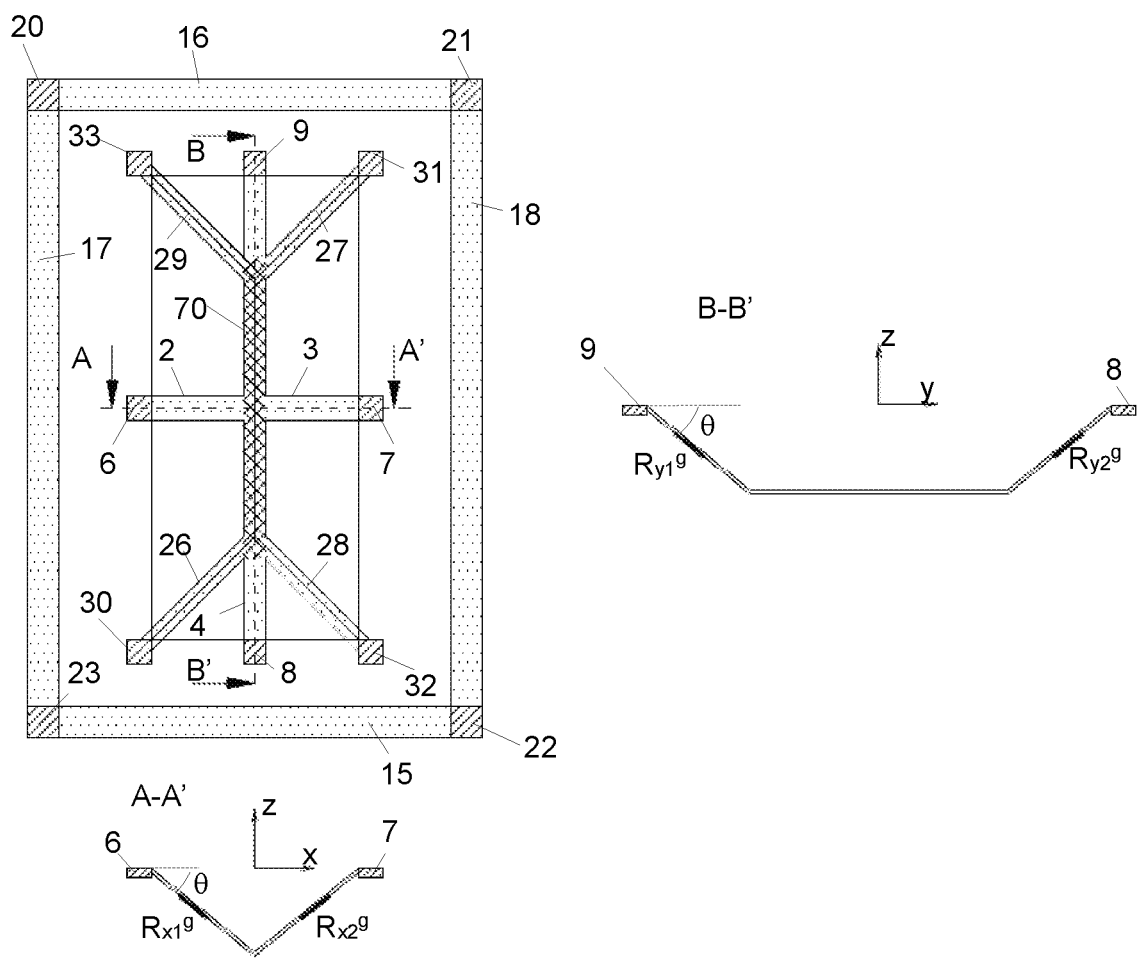
FIG. 14 shows a sensor comprising a cavity in the shape of an elongated pyramid, according to an example embodiment.

FIG. 14 shows yet another embodiment. The sensor in this embodiment comprises a groove in the shape of an elongated inverted pyramid, having a rib at the top instead of a tip. Slanted resistive paths are provided on the sidewalls and along the slanted ribs of the pyramid, in the same manner and numbered with the same numerical references as for the embodiment of FIG. 7. Also in analogy with the latter embodiment, planar resistive paths 15-18 are provided in the vicinity of the cavity. In the embodiment shown, an area 70 comprising the elongated upper rib of the pyramid is subjected to silicidation, so that this area represents an essentially zero resistance. This allows all the formulas as described above to be applied to the pyramid with a tip. Alternatively, contacts could be provided in the middle (i.e. the common area of resistive paths 2 and 3) and at the outer ends (common areas of resistive paths 29,5,27 and 26,4,28) of the elongated upper rib. The inverted elongated pyramid-shaped cavity of FIG. 14 is once again equivalently embodied by a positive elongated pyramid extending out from the substrate with resistive paths on the sidewalls and along the slanted ribs of the pyramid.

In some embodiments, the sensor may comprise multiple cavities or equivalent positive 3D shapes oriented at different angles in the xy plane and provided with slanted resistive paths and planar resistive paths as described above. For example multiple elongated grooves like the ones shown in FIGS. 13 and 14 may be provided with longitudinal axes oriented in the plane of the drawing at mutual angles different from 90°. The additional orientations may allow for the derivation of independent equations that allow the determination of the normal stress components $\sigma_{xx}$, $\sigma_{yy}$ and $\sigma_{zz}$ in a temperature-compensated way. For example, instead of providing resistive paths along the ribs of the cavity of FIG. 14, a second groove may be provided at 45° to the first.

The orientation of the slanted resistive paths relative to the slanted sidewalls of the cavities, prisms or pyramids is not limited to the above-shown examples. In the embodiment of FIGS. 4 and 5, for example, the slanted resistive paths 2 to 5 need not necessarily run between the middle of the sides of the ground plane of the pyramid and the tip area 11. According to other embodiments, slanted resistive paths do not run from the edge of the cavity to the bottom, but only run along a portion of a slanted sidewall. These alternatives may influence the complexity of the equations for calculating the out-of-plane and other stress components, but this mathematical procedure of which an example has been give above, remains within the capabilities of the skilled person. The disclosure is related to the presence of slanted resistive paths configured in a manner which allows the resistance of these paths to be correlated to the stress condition of the sensor. The precise layout of the sensor may differ within the thus-identified framework of the disclosure.

Figure 15:
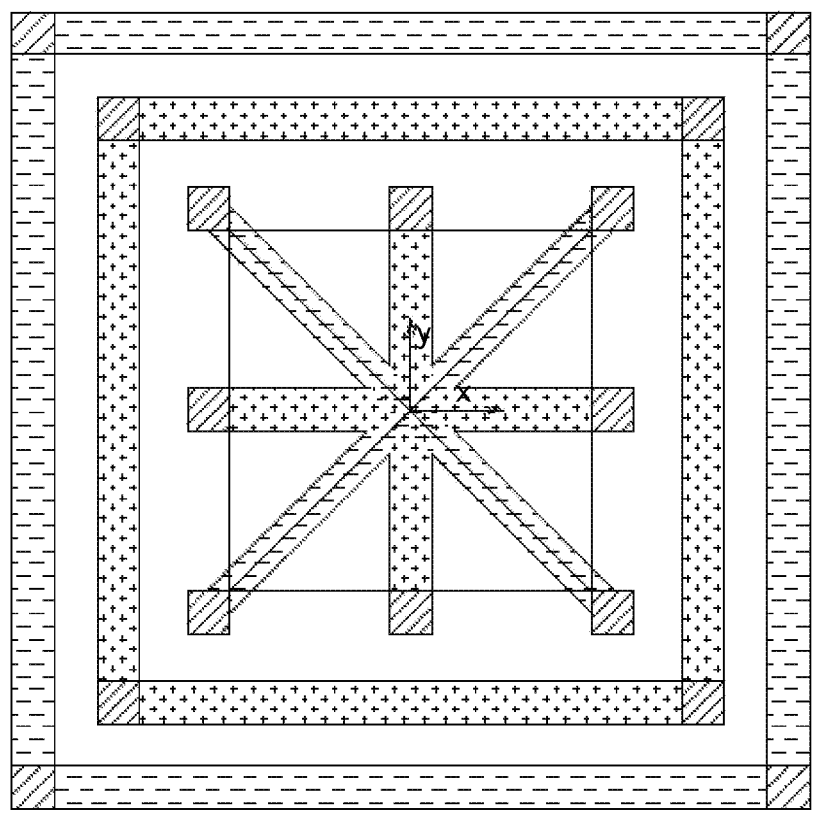
FIG. 15 shows embodiment sensor comprising resistive paths defined by p-type and n-type implants, according to an example embodiment.

In any of the embodiments described above, the resistive paths can be produced by implanting portions of the substrate with dopant elements having one of two opposite polarity types, commonly referred to as p-type or n-type dopants. The coefficients of the piezo-resistive matrix used in the expression (1) are different for n-type and for p-type resistors. Although theoretically, all the stress components can be found when all the resistors of the sensor have the same polarity type, in practice it is often preferred to use a combination of p type and n type resistors, because the coefficients of one or the other polarity type lead to a better-defined set of equations. For example, the slanted resistors $R_{xz}$ and $R_{yz}$ are produced in p-type silicon because the $\pi_{44}$ coefficient is very small for an n-type resistor, leading to an inaccurate determination of $\sigma_{xz}$ from equations (5) and (6). On the other hand, the set of equations (17)(18) (21) is based on n-type resistors. In order to obtain the equations for the correct choice of resistor type (p or n), the sensor may comprise two versions of any of the above-described designs, one with p-type resistors and one with n-type resistors. Alternatively, the sensor may comprise both polarity types in a single design. FIG. 15 shows an example of the latter case for determining all the stress components. Planar p-type as well as n-type resistors are provided around a single cavity, matched on opposite sides of the cavity. P-type resistive paths are indicated by '+' signs and n-type are indicated by '−' signs in the drawing. The slanted resistors on the side walls are p-type while the slanted resistors along the ribs of the pyramid are n-type.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A sensor for monitoring or measuring stress in a semiconductor component, the component comprising a substrate formed of a semiconductor material, the substrate comprising a planar main surface, the sensor comprising:
   at least one slanted surface of the semiconductor material, the slanted surface being defined by an oblique inclination angle with respect to the main surface of the substrate,
   at least one straight resistive path extending on at least part of the slanted surface,
   a plurality of contacts and terminals for accessing the at least one straight resistive path, thereby allowing for a measurement of an electrical resistance of the straight resistive path and an assessment of a shear stress in a plane that is not parallel to the main surface of the substrate.

2. The sensor according to claim 1, comprising at least one pair of slanted surfaces having complementary inclination angles relative to the main surface, and comprising at least one pair of resistive paths which lie in a first plane, wherein the at least one pair of resistive paths comprises a first path on a first slanted surface and a second path on a second slanted surface, wherein the at least one pair of resistive paths also have complementary inclination angles relative to the main surface, and wherein the sensor is configured to measure the shear stress in the first plane defined by the at least one pair of resistive paths.

3. The sensor according to claim 2, comprising two pairs of slanted surfaces and two pairs of slanted resistive paths, wherein the sensor is configured to measure the shear stress in a first plane and a second plane, and wherein the first plane and the second plane are two mutually non-parallel planes.

4. The sensor according to claim 1, further comprising a plurality of planar resistive paths parallel to the plane of the main surface of the substrate and located in a vicinity of the planar resistive paths, as well as a plurality of contacts and terminals for accessing the planar resistive paths, thereby allowing for measurement of an electrical resistance of the planar resistive paths and assessment of one or more additional stress components.

5. The sensor according to claim 1, wherein the one or more slanted surfaces are slanted sidewalls of one or more cavities that are open to the main surface of the substrate or to another surface of the substrate.

6. The sensor according to claim 1, wherein the one or more slanted surfaces are slanted sidewalls of 3-dimensional shapes extending outward from the main surface of the substrate or from another surface of the substrate.

7. The sensor according to claim 5, further comprising:
a first cavity or a 3D shape having the shape of a 4-walled pyramid or a frustum of a 4-walled pyramid, where in the first cavity or the 3D shape comprises:
a rectangular or square base;
a centrally located tip area;
four slanted walls extending respectively between four edges of the base and the centrally located tip area, the four slanted walls forming two pairs of slanted surfaces, wherein surfaces of each pair have complementary inclination angles relative to the main surface of the substrate; and
four slanted ribs extending respectively between corners of the base and the centrally located tip area;
four electrical contacts; and
four slanted resistive paths respectively on the four slanted walls, the four slanted resistive paths extending between the centrally located tip area and the four electrical contacts, wherein the slanted resistive paths on opposite surfaces have complementary inclination angles relative to the main surface of the substrate.

8. The sensor according to claim 7, comprising a fifth electrical contact located in the centrally located tip area, the four slanted resistive paths extending respectively between the four electrical contacts and the fifth electrical contact.

9. The sensor according to claim 7, wherein the four slanted resistive paths merge in the centrally located tip area and wherein the slanted resistive paths on opposing walls of the first cavity or the 3D shape are matched in terms of their electric resistance.

10. The sensor according to claim 7, further comprising:
two planar resistive paths in a vicinity of the first cavity or the 3D shape, the two planar resistive paths running along perpendicular lines in the plane of the main surface of the substrate;
electrical contacts at a start and end location of each planar resistive path, and terminals for accessing the contacts;
four additional electrical contacts located around the first cavity or the 3D shape, one on each of four corners of the first cavity or the 3D shape, and terminals for accessing the four additional electrical contacts; and
four slanted resistive paths, each path running along one of the slanted ribs of the first cavity or the 3D shape, between the respective additional electrical contacts and the centrally located tip area of the first cavity or the 3D shape.

11. The sensor according to claim 10, further comprising two additional planar resistive paths and contacts at a start and end location of each additional planar resistive path, wherein the two additional planar resistive paths run parallel respectively to the two planar resistive paths, wherein the two additional planar resistive paths run on an opposite side of the first cavity or the 3D shape with respect to the respective planar resistive paths, and wherein each pair of parallel planar resistive paths is matched in terms of their electrical resistance.

12. The sensor according to claim 11, wherein the two pairs of parallel planar resistive paths form edges of a rectangle, with four contacts located on the corners of the rectangle.

13. The sensor according to claim 12, further comprising:
two planar resistive paths in a vicinity of the first cavity or the 3D shape, the two planar resistive paths running along perpendicular lines in the plane of the main surface of the substrate;
contacts at a start and end location of each planar resistive path, and terminals for accessing the contacts;
a second cavity or 3D shape of the same shape as the first cavity or 3D shape, and located in close proximity to the first cavity or 3D shape;
four contacts located on four corners of the second cavity or 3D shape and terminals for allowing access to the four corner contacts; and
four slanted resistive paths, each path running along ribs of the second cavity or 3D shape, between the respective corner contacts and a tip area of the second cavity or 3D shape.

14. The sensor according to claim 1, wherein the semiconductor material is a crystalline semiconductor material, and wherein inclination angles are defined by a crystallographic structure of the crystalline semiconductor material.

15. The sensor according to claim 1, wherein the sensor comprises multiple resistive paths obtained by implantation of dopant elements in narrow areas of the slanted surfaces and in narrow areas of the main surface of the substrate or a surface parallel thereto, and wherein the sensor comprises resistive paths formed by implantation of dopant elements of a first polarity type, as well as resistive paths formed by implantation of dopant elements of a second polarity type, wherein the second polarity type is opposite to the first polarity type.

16. A semiconductor component comprising a stress sensor in accordance with claim 1.

* * * * *